US00RE45887E

(19) United States
(12) Reissued Patent
Choi et al.

(10) Patent Number: US RE45,887 E
(45) Date of Reissued Patent: Feb. 9, 2016

(54) ENHANCED VSB VITERBI DECODER

(71) Applicant: LG ELECTRONICS INC., Seoul (KR)

(72) Inventors: In Hwan Choi, Gwacheon (KR); Kyong Won Kang, Seoul (KR)

(73) Assignee: LG ELECTRONICS INC., Seoul (KR)

(21) Appl. No.: 14/451,027

(22) Filed: Aug. 4, 2014

Related U.S. Patent Documents

Reissue of:
(64) Patent No.: 8,135,095
Issued: Mar. 13, 2012
Appl. No.: 12/824,078
Filed: Jun. 25, 2010

U.S. Applications:
(63) Continuation of application No. 14/206,939, filed on Mar. 12, 2014, now Pat. No. Re. 45,506, which is an application for the reissue of Pat. No. 8,135,095, which is a continuation of application No. 11/273,854, filed on Nov. 14, 2005, now Pat. No. 7,933,365.

(30) Foreign Application Priority Data

Nov. 16, 2004 (KR) ..... 10-2004-0093567
Jan. 7, 2005 (KR) ..... 10-2005-0001829

(51) Int. Cl.
*H04L 27/06* (2006.01)
*H03M 13/39* (2006.01)

(52) U.S. Cl.
CPC ..... *H04L 27/06* (2013.01); *H03M 13/3961* (2013.01)

(58) Field of Classification Search
CPC ..... H03M 13/2707; H03M 13/3961; H04L 27/06
USPC ..... 375/341; 348/720
See application file for complete search history.

(56) References Cited

U.S. PATENT DOCUMENTS

| | | | | |
|---|---|---|---|---|
| 5,434,886 | A | 7/1995 | Kazawa et al. | |
| 5,487,069 | A | 1/1996 | O'Sullivan et al. | |
| 5,844,945 | A | 12/1998 | Nam et al. | |
| 5,991,341 | A | 11/1999 | Shin | |
| 6,292,518 | B1 * | 9/2001 | Grabb et al. | 375/321 |
| 6,504,882 | B1 | 1/2003 | Kim | |
| 6,788,710 | B1 * | 9/2004 | Knutson et al. | 370/535 |
| 7,298,420 | B2 * | 11/2007 | Lee | 348/614 |
| 2002/0172277 | A1 | 11/2002 | Choi et al. | |

(Continued)

FOREIGN PATENT DOCUMENTS

| | | |
|---|---|---|
| JP | 05-207075 | 8/1993 |
| KR | 10-2005-0049923 | 5/2005 |

*Primary Examiner* — Linh M Nguyen
(74) *Attorney, Agent, or Firm* — Dentons US LLP

(57) ABSTRACT

An enhanced VSB receiver includes a tuner which tunes an RF signal and converts it into an IF signal, an IF mixer which converts the IF signal into a baseband signal, and a demodulator which demodulates the baseband signal into a VSB signal. The enhanced VSB receiver further includes a map recovery unit which recovers VSB map information of the VSB signal, an enhanced equalizer for compensating channel distortion of the VSB signal and outputting an equalized symbol, and an enhanced Viterbi decoder for estimating whether polarity inversion occurred during a symbol period of the equalized symbol and Viterbi-decoding the equalized symbol based on the polarity estimation.

8 Claims, 21 Drawing Sheets

(56) References Cited

U.S. PATENT DOCUMENTS

2002/0176516 A1 11/2002 Jeske et al.
2002/0181581 A1* 12/2002 Birru et al. ..... 375/240.01
2004/0066738 A1 4/2004 Stopler
2004/0090997 A1 5/2004 Choi et al.
2005/0094752 A1* 5/2005 Frahm et al. ..... 375/350
2006/0039503 A1 2/2006 Choi et al.

* cited by examiner

Enhanced symbol

```
sum(0)=   PMt-1 (0000)+BM(0)
sum(1)=   PMt-1 (1000)+BM(4)
if sum(0) < sum(1)
    PMt (0000)=sum(0)
 else
    PMt (0000)=sum(1)
   end if
```

(a)

Main symbol

```
if BM(0)<BM(4)
if sum(0)=    PMt-1 (0000)+BM(0)
 else
   sum(0)=    PMt-1 (0000)+BM(4)
 end if
if BM(2)<BM(6)
   sum(1)=   PMt-1 (0010)+BM(2)
 else
   sum(1)=   PMt-1 (0010)+BM(6)
 end if
if sum(0)<sum(1)
   PMt (0000)=sum(0)
 else
   PMt (0000)=sum(1)
 end if
```

FIG. 13

(a) Symbol column inputted to Viterbi decoder

| | | | | | | | | | | | | | | | |
|---|---|---|---|---|---|---|---|---|---|---|---|---|---|---|---|
| E1 | E2 | E3 | E4 | M5 | M6 | M7 | M8 | E9 | E10 | E11 | E12 | M13 | M14 | M15 | M16 |
| E17 | E18 | E19 | E20 | E21 | E22 | E23 | E24 | M25 | M26 | M27 | M28 | E29 | E30 | E31 | E32 |

(b) Output of Enhanced/Main integrated decoder (assumption : decoding depth=8)

| | | | | | | | | | | | | | | | |
|---|---|---|---|---|---|---|---|---|---|---|---|---|---|---|---|
| x | x | x | x | x | x | x | x | E1 | E2 | E3 | E4 | M5 | M6 | M7 | M8 |
| E9 | E10 | E11 | E12 | M13 | M14 | M15 | N16 | E17 | E18 | E19 | E20 | E21 | E22 | E23 | E24 |

(c) Output of Enhanced-only decoder (assumption : decoding depth=8)

| | | | | | | | | | | | | | | | |
|---|---|---|---|---|---|---|---|---|---|---|---|---|---|---|---|
| x | x | x | x | x | x | x | x | x | x | x | x | x | x | x | x |
| E1 | E2 | E3 | E4 | E9 | E10 | E11 | E12 | x | x | x | x | E17 | E18 | E19 | E20 |

ENHANCED VSB VITERBI DECODER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

This application *is a continuation reissue application of U.S. Reissue application Ser. No. 14/206,939, filed on Mar. 12, 2014, currently pending, which is a reissue application of U.S. Pat. No. 8,135,095 B2, issued from U.S. patent application Ser. No. 12/824,078, filed on Jun. 25, 2010, which* is a continuation of U.S. application Ser. No. 11/273,854, filed Nov. 14, 2005, now U.S. Pat. No. 7,933,365, which claims the benefit of earlier filing date and *right of* priority to Korean Patent Application No. 10-2005-0001829, filed on Jan. 7, 2005, and Korean Patent Application No. 10-2004-0093567, filed on Nov. 16, 2004, *the contents of* which are *all* hereby incorporated by reference [as if fully set forth herein] *in their entirety*.

BACKGROUND OF THE INVENTION

1. Field of the Invention

The present invention relates to an enhanced 8 vestigial sideband (E8-VSB) receiver, which can receive a plurality of sets of enhanced data, each set of data being encoded by a different code rate, and more particularly, to a VSB receiver having an enhanced Viterbi decoder.

2. Discussion of the Related Art

Since the second half of 1998, the United States of America has adopted an advanced television systems committee (ATSC) 8 vestigial sideband (VSB) transmission method as the 1995 standard for broadcasting. Presently, the Republic of Korea is also providing broadcast programs by adopting the ATSC 8VSB transmission method as the standard for broadcasting. Such ATSC 8VSB transmission method has been established for the essential purpose of high definition imaging.

However, a system that may deteriorate the picture quality, yet stably receive incoming images, or a transmission standard for a system enabling data to be received with more stability as compared to video signals, due to the contents of the data, has also been on demand in the ATSC 8VSB transmission method. In addition, such additional transmission standards are to be regulated within the scope of not affecting the system for receiving the conventional ATSC 8VSB signal. And, also, the receiver of a newly established standard is regulated to be able to receive both the conventional ATSC 8VSB signal and the enhanced 8-VSB (hereinafter referred to as E8-VSB) signal. Accordingly, the E8-VSB system adopts the conventional 8VSB system and adds new types of services, which enable more enhanced reception of signals to be performed. Furthermore, due to the newly added services, the conventional services are also enabled to perform stable receiving functions.

SUMMARY OF THE INVENTION

Accordingly, the present invention is directed to an enhanced 8 vestigial sideband (E8-VSB) Viterbi decoder that substantially obviates one or more problems due to limitations and disadvantages of the related art.

An object of the present invention is to provide an enhanced 8 vestigial sideband (E8-VSB) Viterbi decoder that can perform a Viterbi decoding of an enhanced symbol and a main symbol in an E8-VSB receiving system.

Another object of the present invention is to provide an enhanced 8 vestigial sideband (E8-VSB) Viterbi decoder that can perform a Viterbi decoding of only an enhanced symbol in an E8-VSB receiving system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the present invention provides a vestigial sideband (VSB) receiver and a method of decoding a digital broadcast signal in the VSB receiver. The VSB receiver includes a tuner for tuning an RF broadcast signal and converting the RF signal into an IF signal, and an IF mixer for converting the IF signal into a baseband signal, and a demodulator for demodulating the baseband signal to a VSB signal, and an enhanced equalizer for compensating channel distortion of the VSB signal and outputting an equalized symbol. The VSB receiver further includes an enhanced Viterbi decoder for estimating whether polarity inversion occurred during a symbol period of the equalized symbol and Viterbi-decoding the equalized symbol based on the polarity estimation.

The VSB decoder includes a first accumulate/compare/select (ACS) unit and a second ACS unit. The first ACS unit performs ACS operation for an input symbol assuming that polarity inversion did not occur during a symbol period of the input symbol. On the other hand, the second ACS unit performs ACS operation assuming that polarity inversion did occur during the symbol period. The VSB Viterbi decoder further includes a polarity inversion estimator which estimates polarity of the input symbol, a first path history unit for keeping track of a first path history of the input symbol by saving symbol survivors received from the first ACS unit, and a second path history unit for keeping track of a second path history of the input symbol by saving symbol survivors received from the second ACS unit. Finally, the VSB Viterbi decoder includes a decision selection unit for selecting one of decisions outputted from the first and second path history unit based on the estimated polarity.

The VSB Viterbi decoder further includes a branch metric calculator for calculating branch metrics of the input symbol corresponding to 8 levels and outputting the branch metrics to the first and second ACS units. In one example, the VSB Viterbi decoder may further include a post decoder for post-decoding a C2 bit of the selected decision, and a multiplexer which outputs an X2 bit of the selected decision as an upper bit and outputs a dummy bit as a lower bit when the input symbol is an enhanced symbol. The multiplexer outputs an X1 bit of the selected decision as a lower bit and outputs the post-decoded C2 bit as a upper bit if the input symbol is a main symbol. In alternative example, the VSB Viterbi decoder may further include a symbol re-ordering unit for re-ordering the selected decision by 12-way symbol de-interleaving simultaneously.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the Drawings:

FIG. 13 illustrates examples (a) to (c) of an input column and an output column of the Viterbi decoder;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
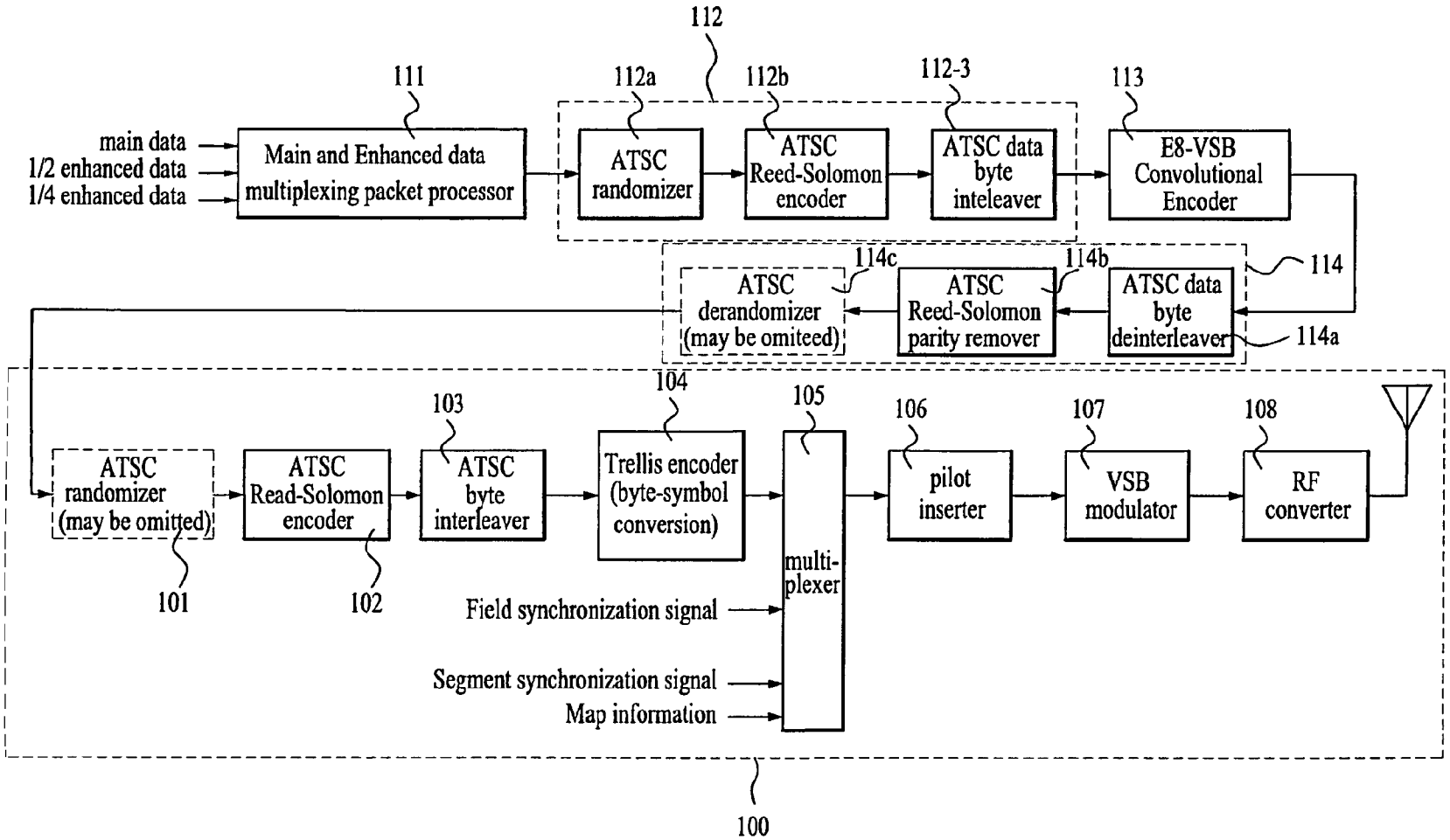
FIG. 1 illustrates a block diagram showing a structure of an E8-VSB transmitting system according to the present invention.
Figure 2:
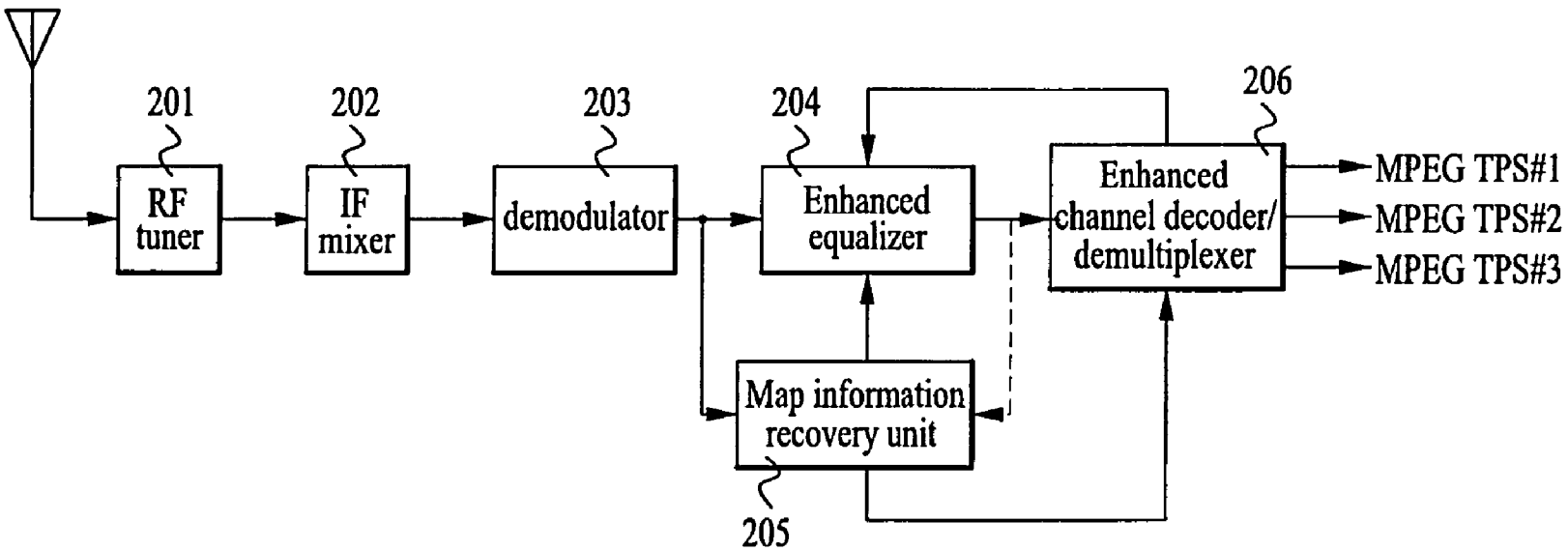
FIG. 2 illustrates a block diagram showing a structure of an E8-VSB receiving system according to the present invention.

A general structure of an E8-VSB standard receiver and transmitter are disclosed herein. More specifically, FIG. 1 illustrates a block diagram of an E8-VSB transmitting system according to the present invention, and FIG. 2 illustrates a block diagram of an E8-VSB receiving system according to the present invention. More specifically, the E8-VSB transmitting system may transmit MPEG-4 images that are currently being used extensively or other diverse additional data (i.e., program execution file, stock information, etc.). The E8-VSB transmitting system may also transmit MPEG-2 images and dolby audio data.

Hereinafter, the conventional MPEG-2 image will be referred to as "main data" or "normal data" for simplicity of the description. Herein, the enhanced data may be additionally processed with error correction encoding as compared to the main data. Also, among the enhanced data, a ½ enhanced data and a ¼ enhanced data refer to data being additionally encoded at a ½ code rate and a ¼ code rate, respectively. Therefore, such enhanced data can perform excellent receptive functions over noise generated from channels and disturbance caused by multiple paths, as compared to the main data. More specifically, the enhanced data that is encoded at a ¼ code rate (i.e., the ½ enhanced data) is more enhanced than the enhanced data that is encoded at a ½ code rate (i.e., the ½ enhanced data).

The general structure of the E8-VSB transmitting system will now be described in detail with reference to FIG. 1. Referring to FIG. 1, a main and enhanced data multiplexing packet processor 111 multiplexes a ½ enhanced data and a ¼ enhanced data to packet units and, then, multiplexes the multiplexed enhanced data and the main data into segment units, thereby outputting the multiplexed data to a first encoder 112. The first encoder 112 includes a randomizer 112a, a Reed-Solomon encoder 112b, and a byte interleaver 112c, which are serially connected to an output terminal of the main and enhanced data multiplexing packet processor 111. The first encoder 112 having the above-described structure sequentially performs data randomizing, Reed-Solomon encoding, and data interleaving processes of the data packet, which is outputted from the main and enhanced data multiplexing packet processor 111. Then, the first encoder 112 outputs the processed data packet to a convolutional encoder 113.

The convolutional encoder 113 converts the byte data that is interleaved and outputted from the first encoder 112 into symbols. Then, the convolutional encoder 113 convolutionally encodes enhanced data symbols only, which are then converted back to byte data and outputted to a first decoder 114. The first decoder 114 includes a byte deinterleaver 114a, a Reed-Solomon parity remover 114b, and a derandomizer 114c, which are serially connected to an output terminal of the convolutional encoder 113. The first decoder 114 having the above-described structure performs data deinterleaving, Reed-Solomon parity removing, and derandomizing processes of the data packet being outputted from the convolutional encoder 113. Then, the first decoder 114 outputs the processed data packet to an 8VSB transmitter 100.

The 8VSB transmitter 100, which has the same structure as the related art ATSC 8VSB transmitting system, includes an ATSC randomizer 101 (may be omitted), an ATSC Reed-Solomon encoder 102, an ATSC byte interleaver 103, a trellis encoder 104, a multiplexer 105, a pilot inserter 106, a VSB modulator 107, and an RF converter 108, More specifically, in the 8VSB transmitter 100, as a set of data having the Reed-Solomon parity removed passes through the Reed-Solomon encoder 102 and the ATSC byte interleaver 103, the data is processed with Reed-Solomon encoding and data interleaving processes. A 20-byte parity symbol is added to the data during the Reed-Solomon encoding process, and an order of the data is switched (or changed) during the data interleaving process. The interleaved data is inputted to the trellis encoder 104. At this point, if the interleaved data is the enhanced data, a null bit of the enhanced data is applied to a lower bit input terminal of the trellis encoder 104, and information bit including information of the enhanced data is applied to a higher bit input terminal of the trellis encoder 104.

The trellis encoder 104 pre-codes the data inputted to the higher bit, and the trellis encoder 104 encodes the data inputted to the lower bit and outputs the trellis-encoded data to the multiplexer 105. The multiplexer 105 multiplexes a trellis-encoded symbol, a field synchronization signal, a segment synchronization signal, and map information, and the pilot inserter 106 inserts a pilot signal herein. Thereafter, the multiplexed signals and information and the pilot signal inserted therein are outputted to the VSB modulator 107. The VSB modulator 107 modulates the signal having the pilot signal inserted therein to an 8VSB signal having an intermediate frequency (IF), which is then outputted to the RF converter 108. The RF converter 108 converts the VSB modulated signal to an RF frequency signal and transmits the converted signal through an antenna.

The E8-VSB receiving system receiving the signal, which is E8-VSB modulated and transmitted from the above-described E8-VSB transmitting system, will now be described in detail with reference to FIG. 2. More specifically, when the E8-VSB modulated RF signal is received through an antenna, a tuner 201 selects only a desired signal by a tuning process. Then, the tuner 201 converts the selected signal to an IF signal and outputs the IF signal to an IF mixer 202. The IF mixer 202 down-converts the IF signal outputted from the tuner 201 to a baseband signal and outputs the down-converted signal to a demodulator 203. Subsequently, the demodulator 203 demodulates the baseband signal to a VSB signal and outputs the demodulated signal to an equalizer 204 and a map information recovery unit 205.

The map information recovery unit 205 recovers the transmitted E8-VSB map information of a current field and outputs the recovered map information to the equalizer 204 and an E8-VSB channel decoder/demultiplexer 206. In addition, based on the E8-VSB map information of the current field, the map information recovery unit 205 generates a set of information indicating the attribute of each of the symbols of the VSB signal. Then, the generated set of information is outputted to the equalizer 204 and the E8-VSB channel decoder/demultiplexer 206. More specifically, the map information recovery unit 205 determines whether the symbol is a main symbol (i.e., a general E8-VSB signal, which may also be referred to as a normal symbol) or an enhanced symbol. When the symbol is an enhanced symbol, the map information recovery unit 205 generates E8-VSB symbol attribute information notifying whether the enhanced symbol is ½ rate coded or ¼ rate coded and, then, outputs the generated attribute information to the equalizer 204 and the E8-VSB channel decoder/demultiplexer 206.

The equalizer 204 receives the outputs from the E8-VSB channel decoder/demultiplexer 206 and the map information recovery unit 205 and compensates channel distortion included in the VSB-demodulated signal. Then, the equalizer 204 outputs the compensated signal to the E8-VSB channel decoder/demultiplexer 206. More specifically, the equalizer 204 may use the output of the map information recovery unit 205 to enhance equalization, and the E8-VSB channel decoder/demultiplexer 206 may perform a channel decoding process suitable to the currently received mode.

Figure 3:
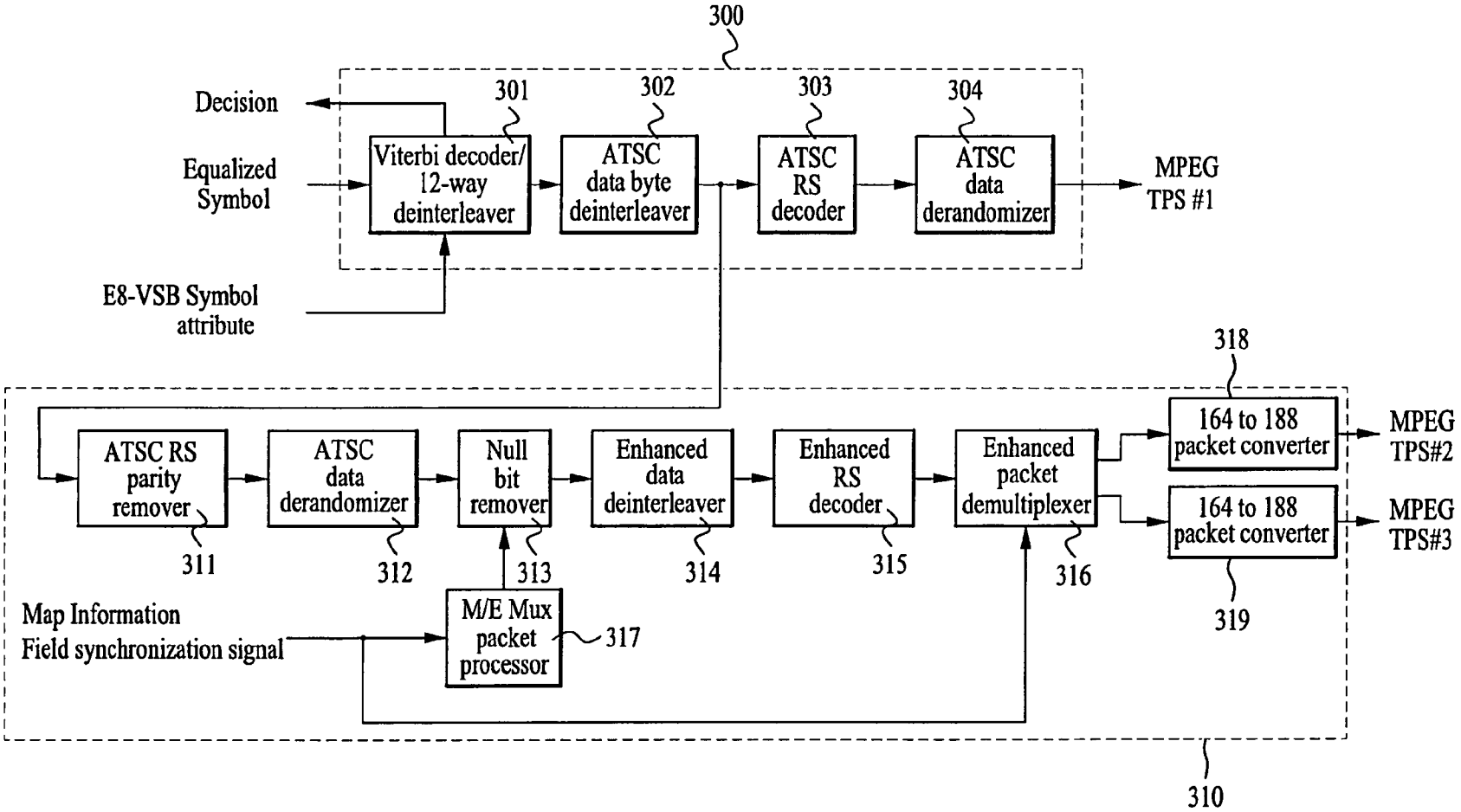
FIG. 3 illustrates a detailed block diagram of an enhanced channel decoder and a demultiplexer shown in FIG. 2.

FIG. 3 illustrates a detailed block diagram of the E8-VSB channel decoder/demultiplexer 206, wherein a separate data path for receiving enhanced data other than that for receiving the main data is included. In other words, by using the E8-VSB map information and the E8-VSB symbol attribute information, which indicate multiplexing information of an E8-VSB signal that is currently being received, the received signal is either decoded or separated to a corresponding mode. Thus, the E8-VSB receiving system can receive a main VSB stream (MPEG TPS #1), and a ½ enhanced stream (MPEG TPS #2) and a ¼ enhanced stream (MPEG TPS #3), which are both enhanced VSB streams. Herein, a "mode" refers to any one of main data (i.e., the conventional ATSC 8VSB data), ¼ enhanced data, and ½ enhanced data.

Referring to FIG. 3, the E8-VSB channel decoder/demultiplexer 206, shown in FIG. 2, includes a main data decoder 300 and an enhanced data decoder 310. Herein, the main data decoder 300 receives the equalized VSB symbol and decodes the main data, and the enhanced data decoder 310 separates and decodes the enhanced data and separates the decoded enhanced data to the ½ enhanced data (MPEG TPS #2) and the ¼ enhanced data (MPEG TPS #3). The main data decoder 300 includes a Viterbi decoder/data deinterleaver 301, an ATSC byte deinterleaver 302, an ATSC RS decoder 303, and an ATSC data derandomizer 304.

More specifically, the main symbol equalized from the equalizer 204 passes through the Viterbi decoder/12-way deinterleaver 301, the ATSC byte deinterleaver 302, the ATSC RS decoder 303, and the ATSC data derandomizer 304 of the main data decoder 300, thereby being decoded as the main stream (MPEG TPS #1), which is similar to the conventional 8VSB channel decoder. In other words, the main symbol is notified to be a main symbol by the EB-VSB data attribute generator. Therefore, the main symbol may be received through the path of the conventional channel decoding mode. However, in case of the E8-VSB signal, since the main data and the enhanced data are multiplexed, two types of modifications are required to be made in the channel decoder. The Viterbi decoder should perform decoding that is suitable for each attribute, based on the attributes of the VSB symbol. And, a separate data path for an enhanced VSB (EVSB) stream should be included.

The enhanced data decoder 310 is a data path for receiving and decoding the EVSB stream, and the enhanced data decoder 310 includes an ATSC RS parity remover 311, an ATSC data derandomizer 312, a null bit remover 313, an enhanced data deinterleaver 314, an enhanced RS decoder 315, an enhanced packet demultiplexer 316, a main and enhanced (M/E) multiplexer (MUX) packet processor 317, and two 164-to-188 packet converters (or first and second packet converters) 318 and 319. In the above-described E8-VSB channel decoder/demultiplexer 206 of FIG. 3, the E8-VSB symbol that is equalized from the equalizer 204 and the E8-VSB symbol attribute information that is created from the map information recovery unit 205 are synchronized and inputted to the Viterbi decoder/12-way deinterleaver 301.

The synchronized symbol that is inputted to the Viterbi decoder/12-way deinterleaver 301 includes the main symbol and the enhanced symbol. Accordingly, the Viterbi decoder identifies the main symbol and the enhanced symbol in accordance with the E8-VSB symbol attribute information and performs a Viterbi decoding process accordingly. And, at the same time, the Viterbi decoder also performs a 12-way deinterleaving process and outputs the corresponding result, in byte unit values, to the ATSC byte deinterleaver 302. The value that is decided during the decoding process in the Viterbi decoder is fed-back to the equalizer 204. The ATSC byte deinterleaver 302 deinterleaves the byte-unit data that is outputted from the Viterbi decoder/12-way deinterleaver 301.

More specifically, as a reverse process of the ATSC byte interleaver shown in FIG. 1, the ATSC byte deinterleaver 302 deinterleaves the output of the Viterbi decoder/12-way deinterleaver 301 and, then, outputs the deinterleaved result in packet units. The packet data that is outputted from the ATSC byte deinterleaver 302 is inputted to the ATSC RS decoder 303 and the ATSC RS parity remover 311 of the enhanced data decoder 310. The ATSC RS decoder 303 processes the output of the ATSC byte deinterleaver 302 with RS decoding and outputs the RS decoded output to the ATSC data derandomizer 304. When the ATSC RS decoded data is derandomized from the ATSC data derandomizer 304, the derandomized data is finally outputted as a main signal (i.e., MPEG TPS #1). Since the enhanced streams are determined as null packets when observed from the conventional MPEG TP stream, thereby being ignored by the MPEG decoder, only the MPEG TP stream of the main VSB is received without failure.

The ATSC RS parity remover 311 of the enhanced data decoder 310 removes an ATSC RS parity portion from the packet data, which is outputted from the ATSC byte deinterleaver 302, and outputs the ATSC RS parity removed data packet to the ATSC data derandomizer 312. The ATSC data derandomizer 312 derandomizes the ATSC RS parity removed data packet, which is then outputted to the null bit remover 313. The null bit remover 313 removes all of the byte unit data, when the data is a main data byte. When the data is a ½ enhanced data byte, the null bit remover 313 removes the null bit, thereby outputting 2 bytes in 1 byte. And, finally, when the data is a ¼ enhanced data byte, the null bit remover 313 removes the null bit, thereby outputting 4 bytes in 1 byte. Each of the byte are determined to be a main data byte, a ½ enhanced data byte, and a ¼ enhanced data byte in accordance with a set of E8-VSB byte attribute information outputted from the main and enhanced (M/E) multiplexer (MUX) packet processor 317.

The enhanced data deinterleaver 314 deinterleaves EVSB byte unit data, which are formed of significant bits outputted from the null bit remover 313, and outputs the deinterleaved data to the enhanced RS decoder 315. The enhanced RS decoder 315 decodes the deinterleaved data and outputs the decoded data to the enhanced packet demultiplexer 316. Subsequently, by using the E8-VSB map information and the field synchronization signal outputted from the map information recovery unit 205, the enhanced packet demultiplexer 316 separates the enhanced RS decoded data to a 164-byte ½ enhanced data packet and ¼ enhanced data packet. The ½ enhanced data packet is outputted to the first packet converter 318, and the ¼ enhanced data packet is outputted to the second packet converter 319. The first packet converter 318 separates and outputs the ½ enhanced data packet, which is initially inputted as a 164-byte packet, into 188-byte packet units without modifying the data (i.e., MPEG TPS #2). The second packet converter 319 outputs the ¼ enhanced data packet, which is initially inputted as a 164-byte packet, into 188-byte packet units without modifying the data (i.e., MPEG TPS #3).

Among the enhanced channel decoder and demultiplexer of the E8-VSB receiving system according to the present invention, the present invention is related to the embodiment of a Viterbi decoder that can perform decoding processes in accordance with the attribute of a corresponding E8-VSB symbol. Herein, instead of decoding the convolutional encoder 113 and the trellis encoder 104 of the E8-VSB transmitting system over two process steps, the E8-VSB receiving system according to the present invention performs the decoding process in a single step from the Viterbi decoder.

Figure 11:
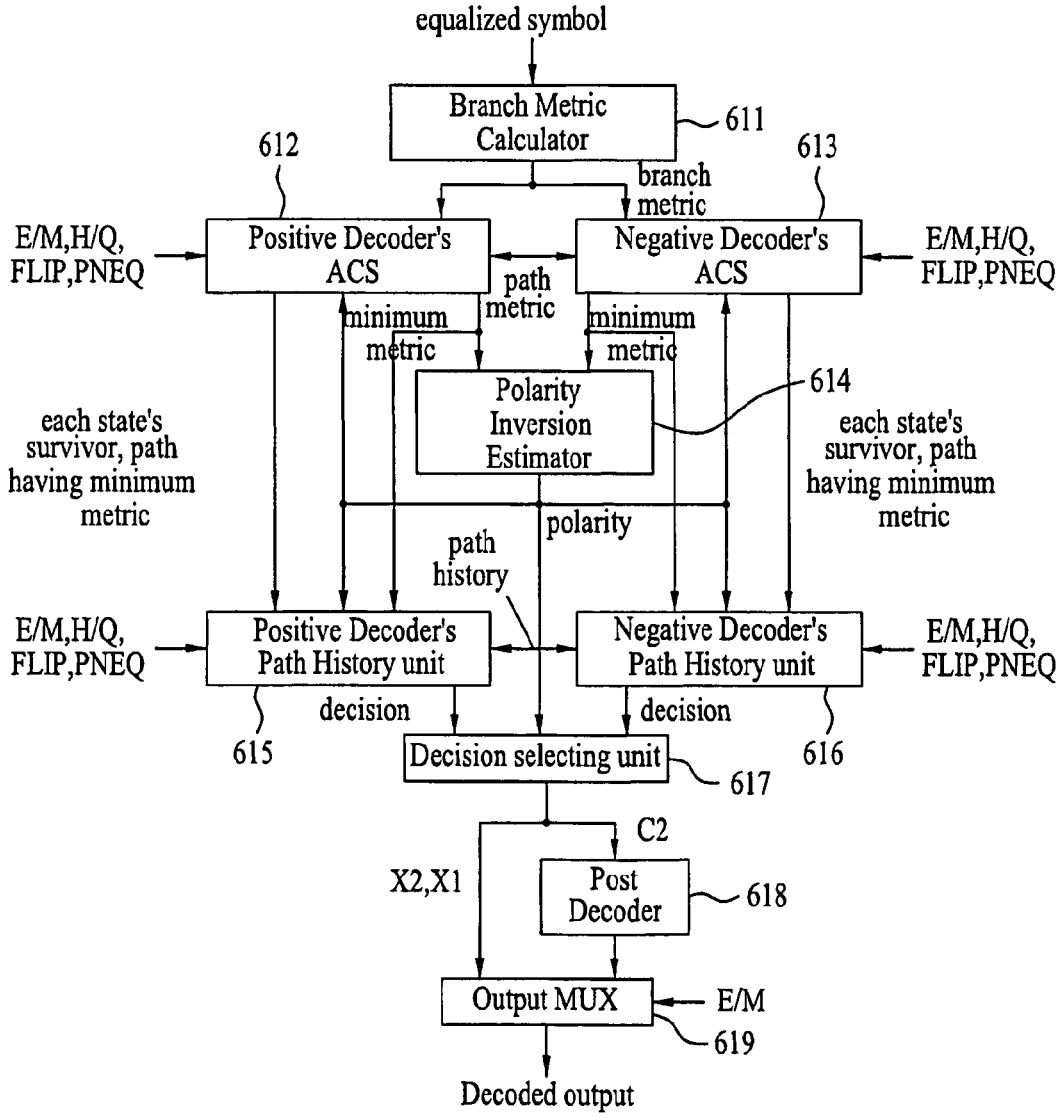
FIG. 11 illustrates an enhanced/main integrated Viterbi decoder according to a first embodiment of the present invention.

FIG. 11 illustrates a block diagram showing the structure of the Viterbi decoder according to a first embodiment of the present invention, which is an example of an enhanced/main integrated Viterbi decoder. Referring to FIG. 11, the Viterbi decoder according to the first embodiment of the present invention includes a branch metric calculator 611, an accumulate/compare/select (ACS) unit 612 of the positive decoder, an accumulate/compare/select (ACS) unit 613 of the negative decoder, a polarity inversion estimator 614, a path history unit 615 of the positive decoder, a path history unit 616 of the negative decoder, a decision selecting unit 617, a post decoder 618, and an output multiplexer (MUX) 619.

Figure 15:
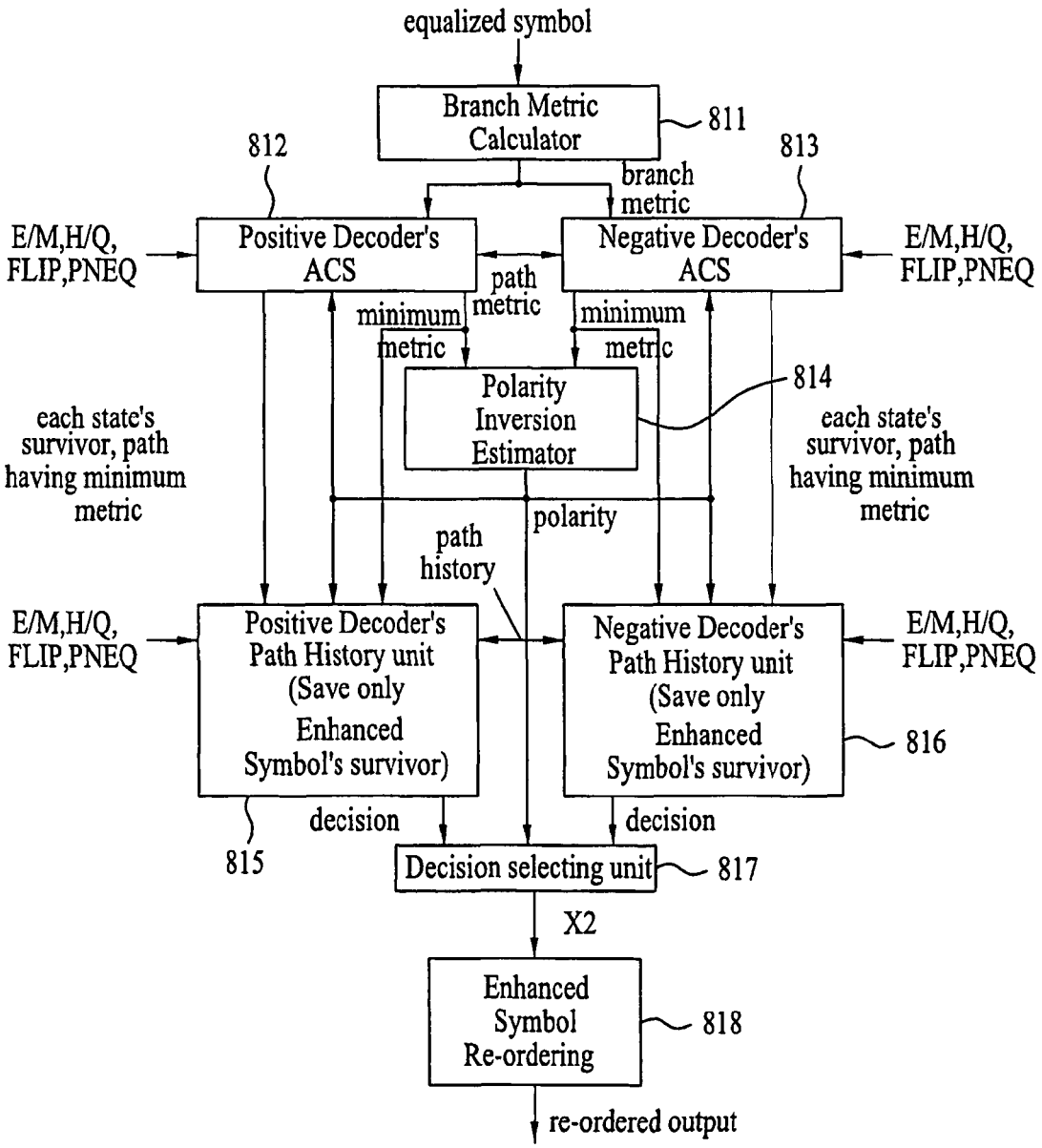
FIG. 15 illustrates an enhanced-only Viterbi decoder according to a second embodiment of the present invention.

FIG. 15 illustrates a block diagram showing the structure of the Viterbi decoder according to a second embodiment of the present invention, which is an example of an enhanced-only Viterbi decoder. Referring to FIG. 15, the Viterbi decoder according to the second embodiment of the present invention includes a branch metric calculator 811, an accumulate/compare/select (ACS) unit 812 of the positive decoder, an accumulate/compare/select (ACS) unit 813 of the negative decoder, a polarity inversion estimator 814, a path history unit 815 of the positive decoder, a path history unit 816 of the negative decoder, a decision selecting unit 817, and an enhanced symbol re-ordering unit 818. Prior to describing the difference between the Viterbi decoder according to the first embodiment of the present invention and the Viterbi decoder according the second embodiment of the present invention, the convolutional encoder 113 and the trellis encoder of the E8-VSB transmitting system, shown in FIG. 1, and the corelation between the two member parts will now be described in detail.

Figure 4A:
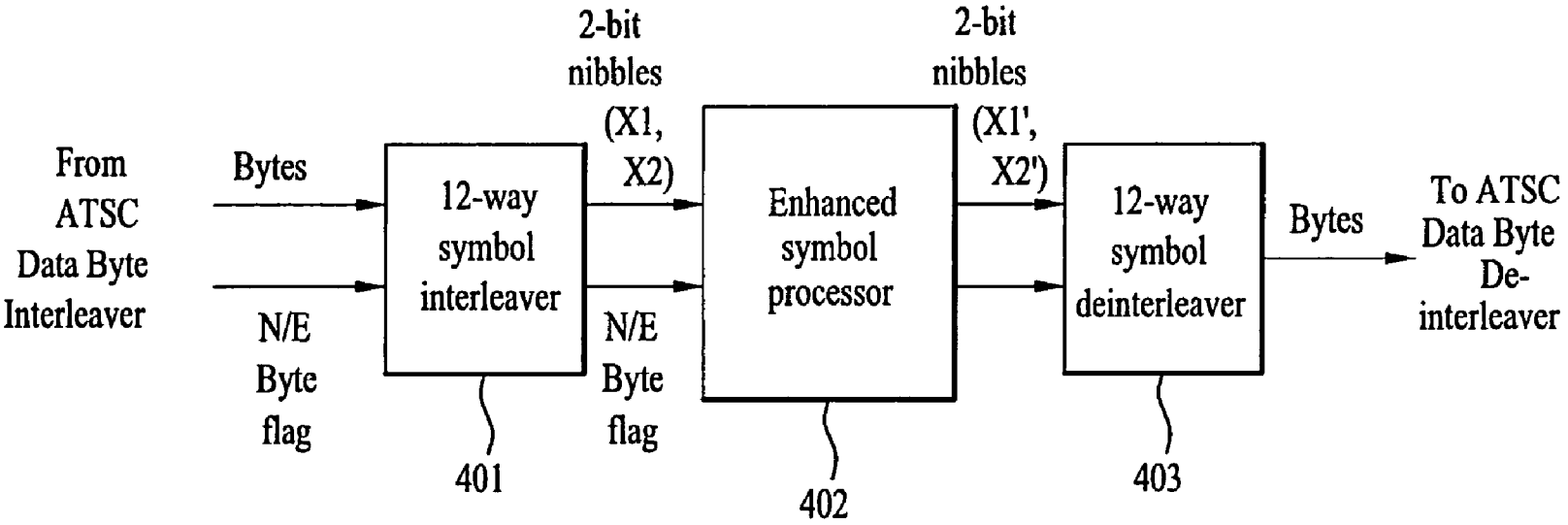
FIG. 4A illustrates a detailed block diagram of an E8-VSB convolution encoder shown in FIG. 1.

FIG. 4A illustrates a detailed block diagram of the convolutional encoder 113, which includes a 12-way symbol interleaver 401, an enhanced symbol processor 402, and a 12-way symbol deinterleaver 403. Referring to FIG. 4A, the 12-way symbol interleaver 401 converts the data being inputted in byte units to symbol units (i.e., units consisting of 2-bit nibbles X2 and X1). Then, the 12-way symbol interleaver 401 interleaves the converted data, which are outputted to the enhanced symbol processor 402. When the inputted data is a main symbol, the inputted data bypasses the enhanced symbol processor 402 and proceeds to the 12-way symbol deinterleaver 403. Meanwhile, when the inputted data is an enhanced symbol, symbol processing is performed only on the data (X2) that is inputted as the higher bit, and the symbol processed data is outputted to the 12-way symbol deinterleaver 403, whereas the data (X1) inputted as the lower bit is discarded. Subsequently, the 12-way symbol deinterleaver 403 deinterleaves the data being outputted from the enhanced symbol processor 402, outputs the deinterleaved data symbols into byte units, and outputs to the first decoder 114.

Figure 4B:
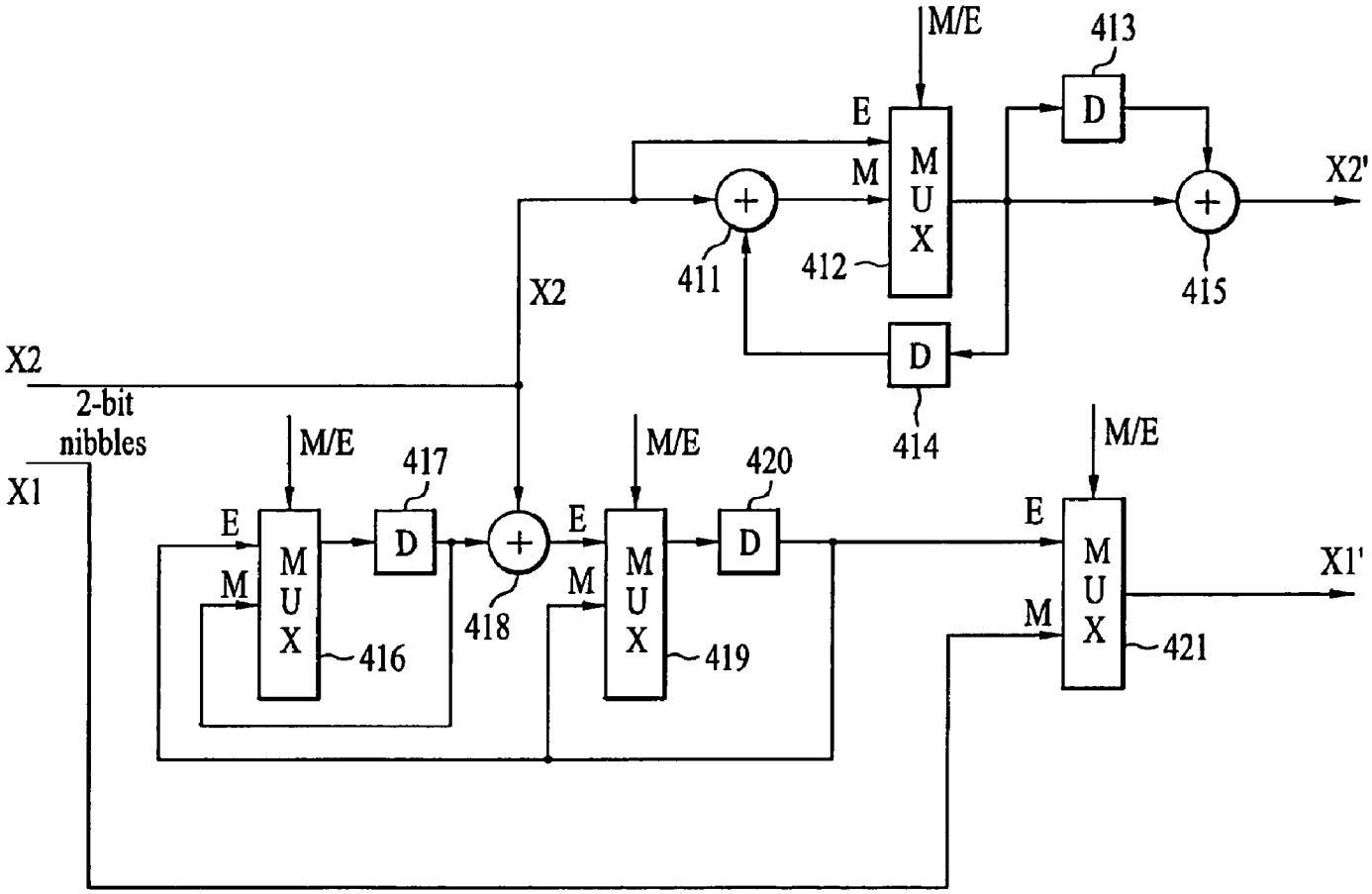
FIG. 4B illustrates a detailed block diagram of an enhanced symbol processor shown in FIG. 4A.

FIG. 4B illustrates a detailed block diagram of the enhanced symbol processor 402. Herein, an adder 411 adds the data (X2) that is inputted as the higher bit and the data that is fed-back from a register 414. Then, the adder 411 outputs the added data to a multiplexer 412. When the symbol being inputted is a main symbol, the multiplexer 412 selects the output of the adder 411. And, when the symbol being inputted is an enhanced symbol, the adder 411 selects the data (X2) that is inputted as the higher bit. Then, the multiplexer 412 outputs the selected data to the registers 413 and 414 and an adder 415. The register 413 delays the output of the multiplexer 412 by one symbol and outputs the delayed output to the adder 415. The adder 415 adds the output of the multiplexer 412 and the output of the register 413 and, then, outputs the added output as the higher bit (X2'). Herein, the register 413 is a type of delayer, and such function also applies equally to other registers. The register 414 delays the output of the multiplexer 412 by one symbol and feeds-back the delayed output to the adder 411.

Subsequently, when the symbol being inputted is a main symbol, the multiplexer 416 selects the output of the register 417. And, when the symbol being inputted is an enhanced symbol, the multiplexer 416 selects the output of the register 420. Then, the multiplexer 416 outputs the selected output to the register 417. The register 417 delays the output of the multiplexer 416 by one symbol unit and, then, outputs the delayed output to the adder 418 and simultaneously feeds-back the delayed output to the multiplexer 416. The adder 418 adds the data (X2) being inputted as the higher bit and the output of the register 417 and, then, outputs the added data to the multiplexer 419.

When the symbol being inputted is a main symbol, the multiplexer 419 selects the output of the register 420. And, when the symbol being inputted is an enhanced symbol, the multiplexer selects the output of the adder 418. Thereafter, the multiplexer 419 outputs the selected output to the register 420. The register 420 delays the output of the multiplexer 419 by one symbol unit and, then outputs the delayed output to another multiplexer 421 and, simultaneously, feeds-back the delayed output to the multiplexers 417 and 419. When the inputted signal is a main symbol, the multiplexer 421 selects the data (X1) being inputted as the lower bit and outputs the selected data as a lower bit (X1'). When the inputted signal is an enhanced symbol, the multiplexer 421 selects the output of the register 420 and outputs the selected output as a lower bit (X1').

A total of 12 enhanced symbol processors 402 having the above-described structure are included in the E8-VSB convolutional encoder 113. The symbol processing of the enhanced symbol processor 402 may vary depending upon whether the symbol that is being inputted is a main symbol or an enhanced symbol. More specifically, referring to FIG. 4B, the select signal (i.e., M/E flag) that is inputted to the multiplexer 412, 416, 419, and 421 indicates whether the symbol (i.e., symbol consisting of 2-bit nibbles X1 and X2) currently being inputted is a main symbol or an enhanced symbol, which can be encoded at a ½ code rate or a ¼ code rate.

Figure 4C:
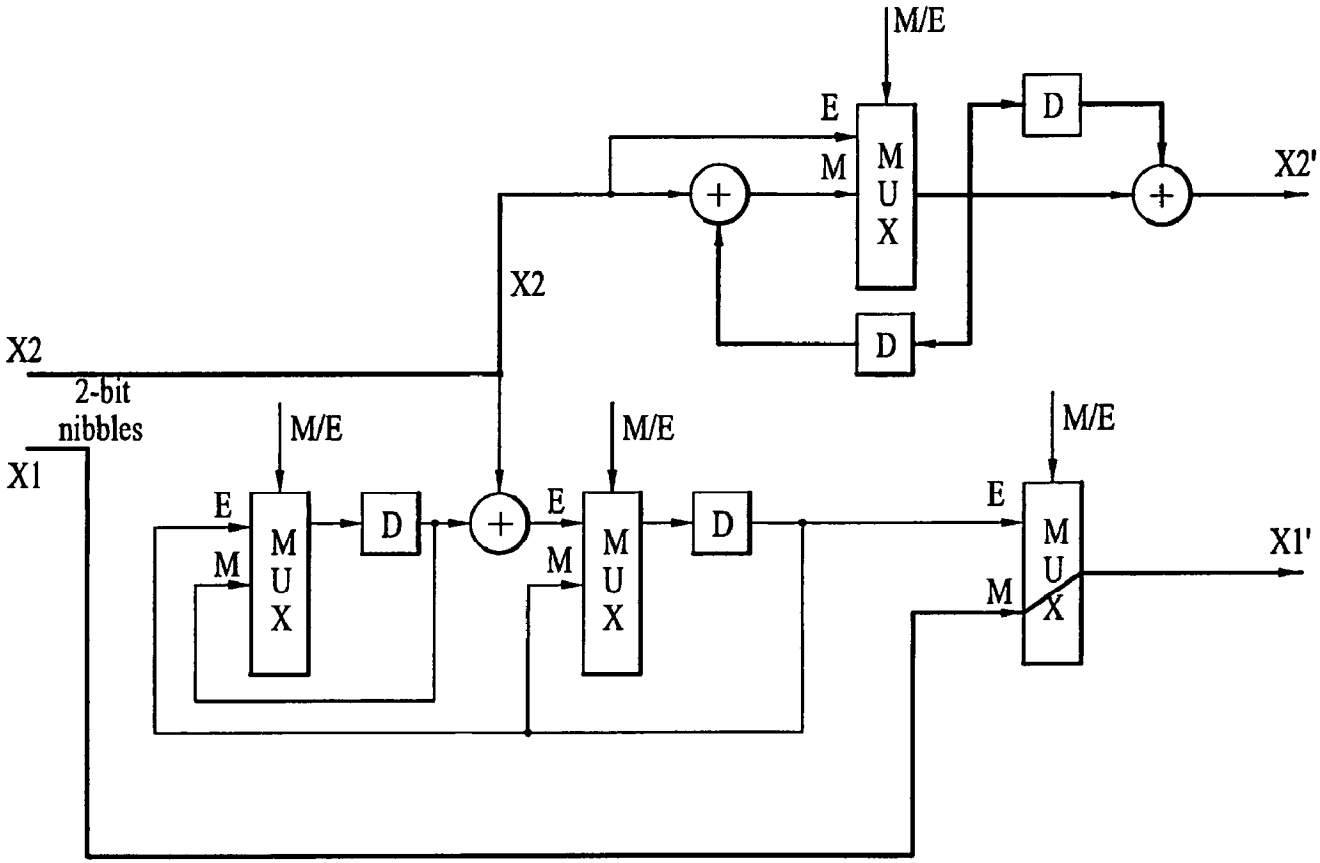
FIG. 4C illustrates a detailed block diagram showing a data flow, when a symbol inputted to the enhanced symbol processor of FIG. 4B is a main symbol.

FIG. 4C illustrates a data path indicated from the enhanced symbol processor, when the inputted symbol is a main symbol. More specifically, when the symbol that is inputted is a main symbol, the data (X1) being inputted as a lower bit is bypassed as X1' through the multiplexer 421, and the data (X2) being inputted as a higher bit is bypassed as X2' through the adder 411, the multiplexer 412, the registers 413 and 414, and the adder 415. The adder 411 and the register 414 have the structure of a pre-coder, and the adder 415 and the register 413 have the structure of a post-decoder. Herein, since the functions of the pre-coder and the post-decoder are canceled out with respect to each other, the data (X2) being inputted as the higher bit may be directly bypassed as X2'.

Figure 4D:
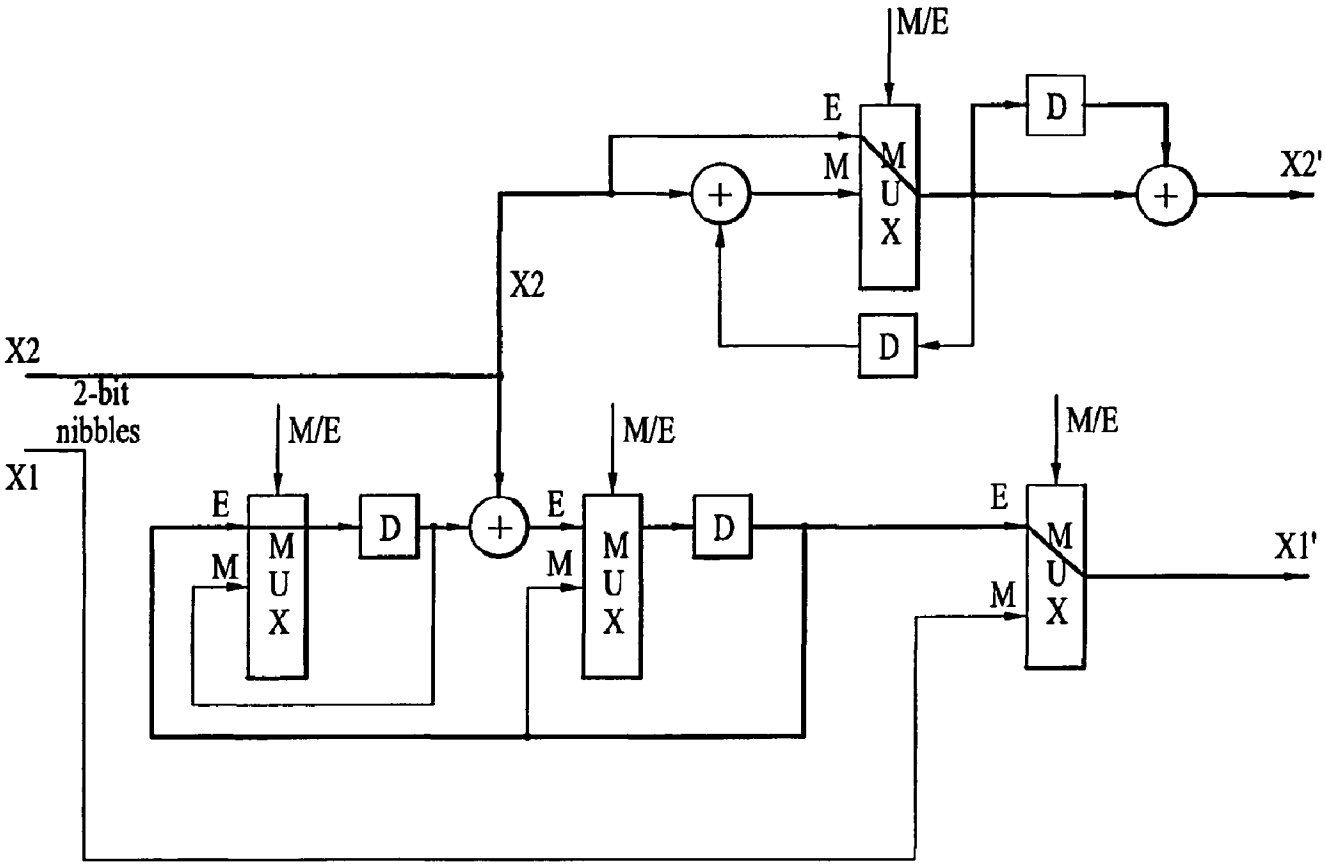
FIG. 4D illustrates a detailed block diagram of a data flow, when a symbol inputted to the enhanced symbol processor of FIG. 4B is an enhanced symbol.

FIG. 4D illustrates a data path indicated from the enhanced symbol processor, when the inputted symbol is an enhanced symbol. More specifically, when the symbol being inputted is an enhanced symbol, the data (X2) being inputted as the higher bit is post-decoded from the post-decoder, which consists of the register 413 and the adder 415, and then outputted as X2'. Also, the data (X2) being inputted as the higher bit is convolutionally encoded from the convolution encoder, which consists of the register 417, the adder 418, and the register 420. And, the parity bit that is generated during the encoding process is outputted as X1', and the data (X1) that is inputted as the lower bit is discarded.

FIG. 5 illustrates an example of concatenation between the enhanced symbol processor and the trellis encoder. In the E8-VSB transmitting system, a plurality of blocks actually exists between the enhanced symbol processor and the trellis encoder. However, the Viterbi decoder 301 in the enhanced channel decoder/demultiplexer 206 decodes the equalized symbol in a manner that the enhanced symbol processor and the trellis encoder by assuming they are directly concatenated. Referring to FIG. 5, the trellis encoder 104 includes a pre-coder 510 connected to the higher bit, and the convolution encoder 520 connected to the lower bit. Herein, the trellis encoder 104 encodes the two input bits X2 and X1, which are outputted as three output bits C2, C1, and C0. More specifically, the data (X2) inputted as the higher bit is pre-coded from the pre-coder 510, thereby creating an output bit (C2). Also, the data (X1) being inputted as the lower bit is directly bypassed and outputted as output bit (C1). Simultaneously, the data (X1) being inputted as the lower bit is encoded from the convolution encoder 520. The parity bit created during this process becomes the output bit (C0). In other words, the output bit (C0) is decided in accordance with a value stored in the register (M0).

Figure 5A:
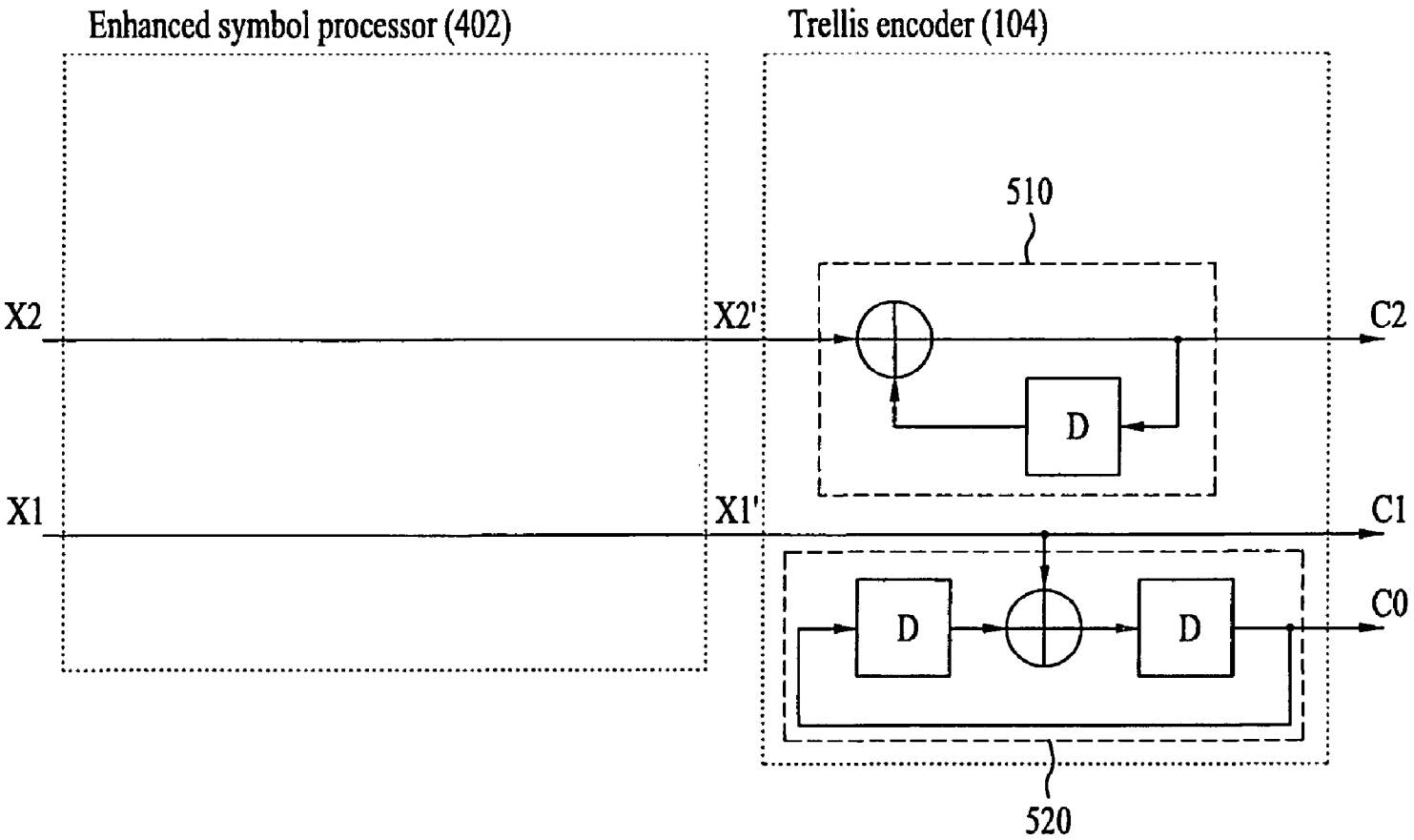
FIG. 5A illustrates an enhanced symbol processor and a trellis encoder for processing a main symbol.

FIG. 5A illustrates the enhanced symbol processor and a trellis encoder being concatenated, when the inputted symbol is a main symbol. As shown in FIG. 7C, when the inputted symbol is a main symbol, the two inputted bits X2 and X1 are directly bypassed as X2' and X1' and inputted to the trellis encoder 104. More specifically, the higher bit (X2) that is inputted to the enhanced symbol processor 402 is inputted directly to the pre-coder 510 of the trellis encoder 104. In addition, the lower bit (X1) that is inputted to the enhanced symbol processor 402 is inputted directly to the convolution encoder 520 of the trellis encoder 104.

Figure 5B:
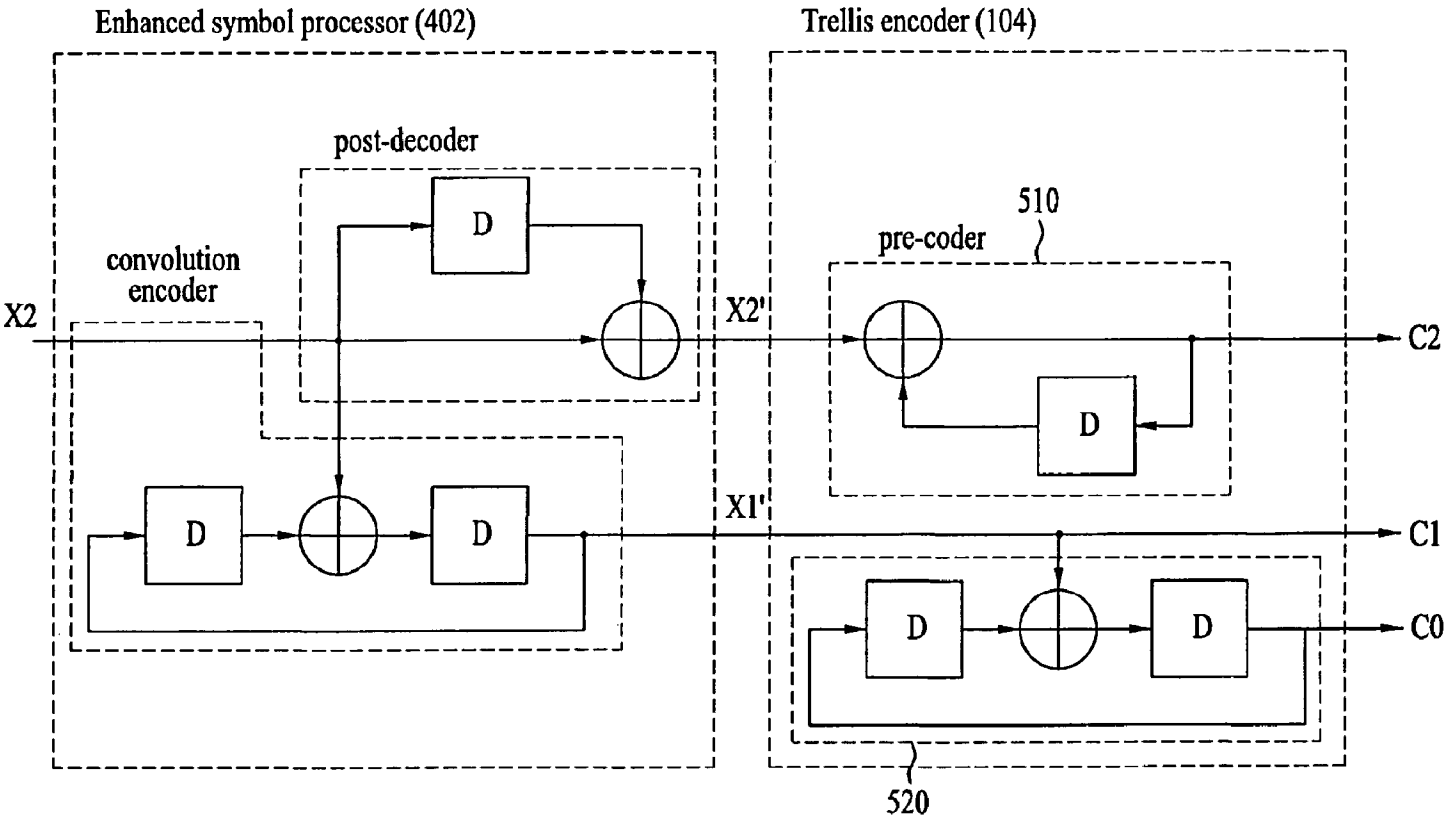
FIG. 5B illustrates an enhanced symbol processor and a trellis encoder for processing an enhanced symbol.
Figure 5C:
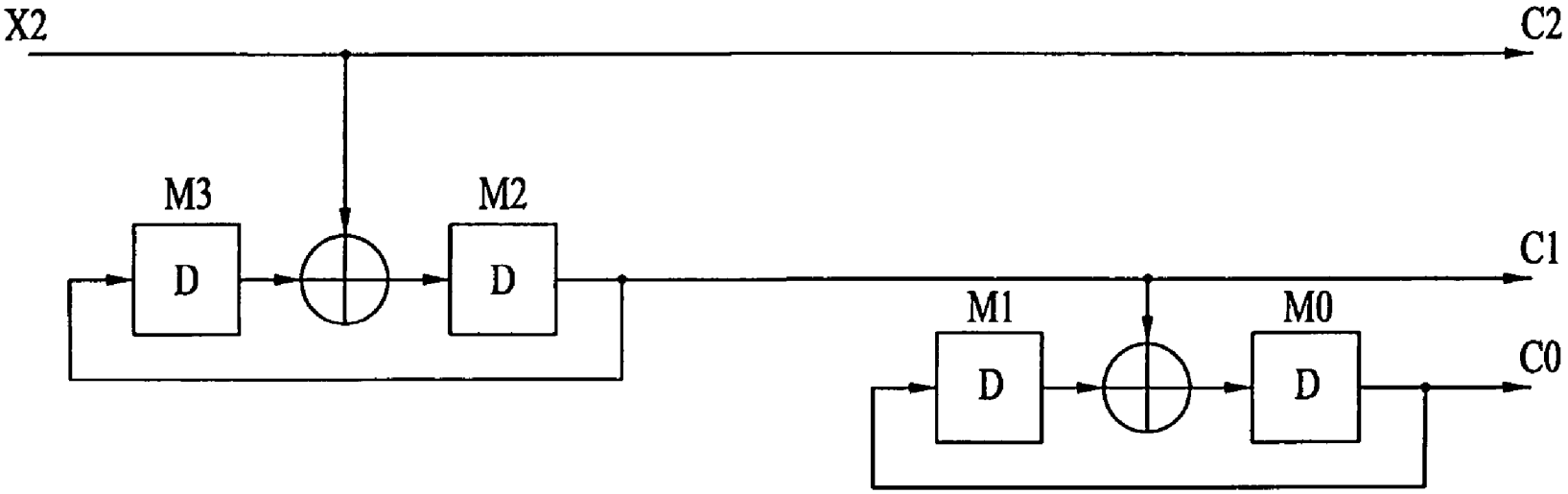
FIG. 5C illustrates an enhanced symbol processor and a trellis encoder processing an enhanced symbol, where the functions of a post decoder and a pre-coder are canceled out.

FIG. 5B illustrates the enhanced symbol processor and a trellis encoder being concatenated, when the inputted symbol is an enhanced symbol. As shown in FIG. 4D, the data (X1) being inputted as the lower bit is discarded, and the data (X2) being inputted as the higher bit passes through the post-decoder and is outputted to the trellis encoder 104 as X2'. In addition, the data (X2) that is inputted as the higher bit is convolutionally encoded from the convolution encoder, and the parity bit that is generated during the process is outputted to the trellis encoder 104 as X1'. In other words, the higher bit (X2'), which is post-decoded and outputted from the enhanced symbol processor 402, is inputted to the pre-coder 510 of the trellis encoder 104. On the other hand, the lower bit (X1'), which is convolutionally encoded and outputted from the enhanced symbol processor 402, is inputted to the convolution encoder 520 of the trellis encoder 104. Since the functions of the post-decoder of the enhanced symbol processor 402 and the pre-coder of the trellis encoder 104, which are applied to the X2 of the enhanced symbol, may be canceled out, X2 is directly bypassed as C2, as shown in FIG. 5C. Therefore, the Viterbi decoder of the E8-VSB receiving system according to the present invention may perform decoding processes of the main symbol and the enhanced symbol by using Viterbi decoding algorithms that are generally used in the examples shown in FIG. 5A and FIG. 5C, respectively.

Figure 6:
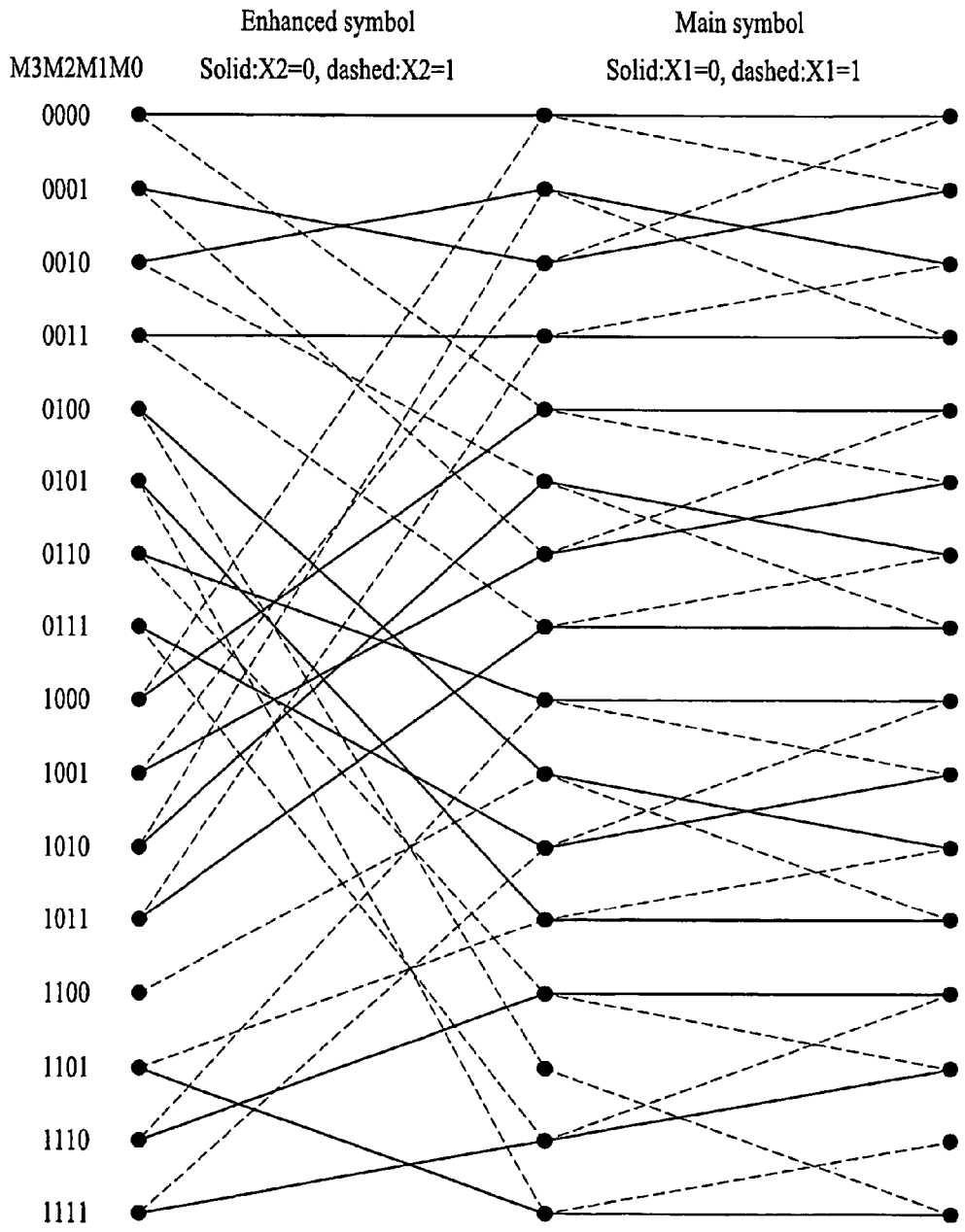
FIG. 6 illustrates a state transition diagram of the enhanced symbol and the main symbol.

FIG. 6 illustrates a state transition diagram of the enhanced symbol and the main symbol. More specifically, when the symbol is an enhanced symbol, the states for the registers M3, M2, M1, M0 (shown in FIG. 5C) are defined herein, and 16 different states exist in total. When the symbol is a main symbol, M3 and M2 maintain the values changed from the previous enhanced symbol, and so the state transition pattern may be repeated 4 times, as shown in FIG. 6. In other words, when the symbol is a main symbol, as shown in FIG. 5A, the input data X2 and X1 is bypassed directly from the enhanced symbol processor 402 to the trellis encoder 104.

Referring to FIG. 6, when the symbol is an enhanced symbol, the input bit X2 changes the state. And, conversely, when the symbol is a main symbol, the input bit X1 changes the state. More specifically, this is because the input bit X1 is discarded and the input bit X2 passes through 4 registers M3, M2, M1, and M0, as shown in FIG. 5C, when the symbol in the enhanced symbol. On the other hand, when the symbol is the main symbol, the input bit X1 passes through the registers M1 and M0, as shown in FIG. 5A. At this point, the enhanced symbol is identified as one of a ½ enhanced symbol and a ¼ enhanced symbol.

However, the enhanced symbol processor (shown in FIG. 4B) treat the input symbol equally, when the symbol is the enhanced symbol, without determining whether the input symbol is the ½ enhanced symbol or the ¼ enhanced symbol. Unlike the ½ enhanced symbol, in a byte expander included in the E8-VSB transmitting system, the input bit is repeated 2 times, when the symbol is a ¼ enhanced symbol. However, the repeated ¼ enhanced symbol may be randomly changed by a data randomizer, thereby causing the repeated symbols to be identical to or different from one another. And, since the E8-VSB receiving system is aware of the operations of the data randomizer, the E8-VSB receiving system is capable of identifying whether the repeated symbols are identical to or different from one another.

Figure 7A:
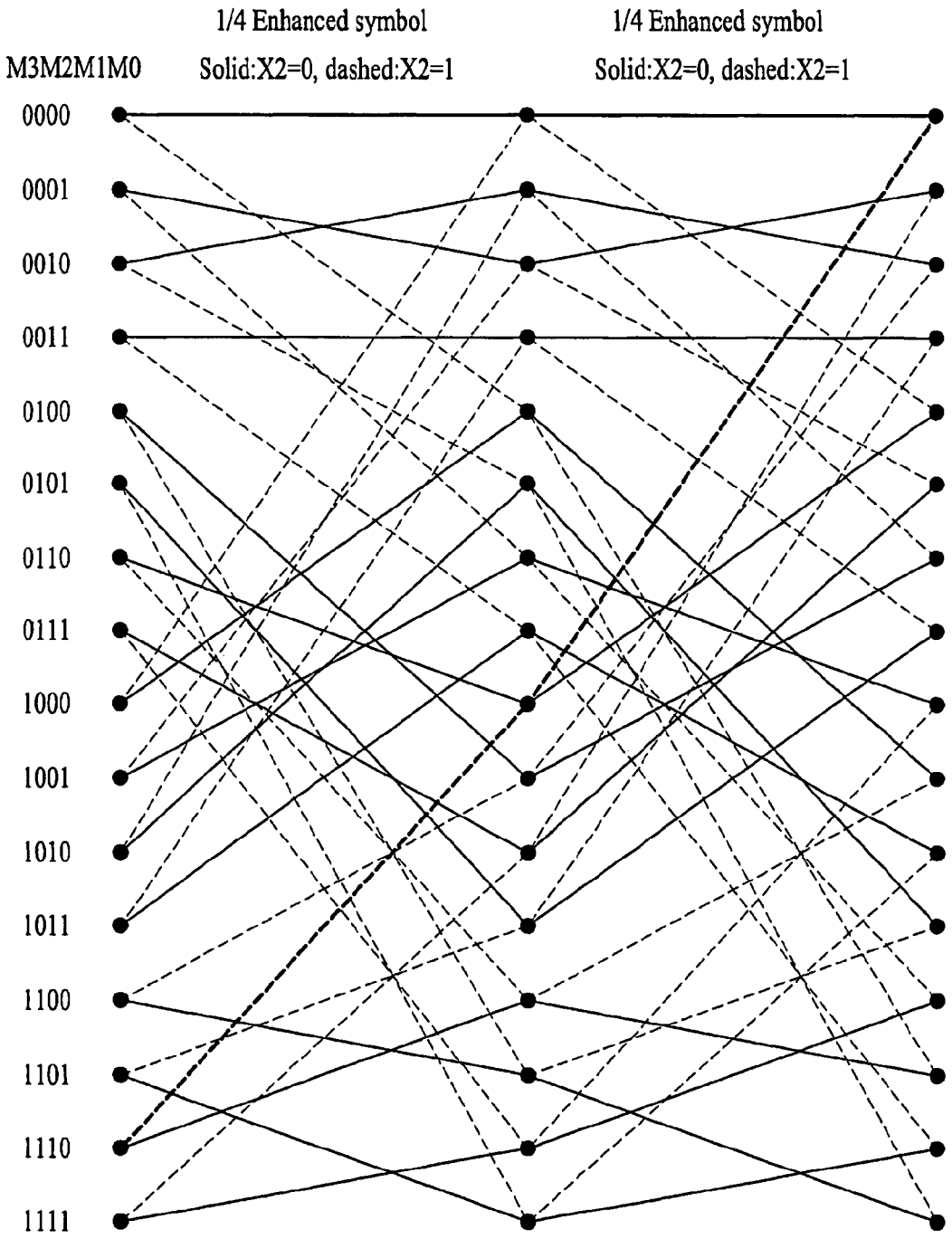
FIG. 7A illustrates a state transition diagram of a ¼ enhanced symbol, when repeated ¼ symbols are identical to one another.
Figure 7B:
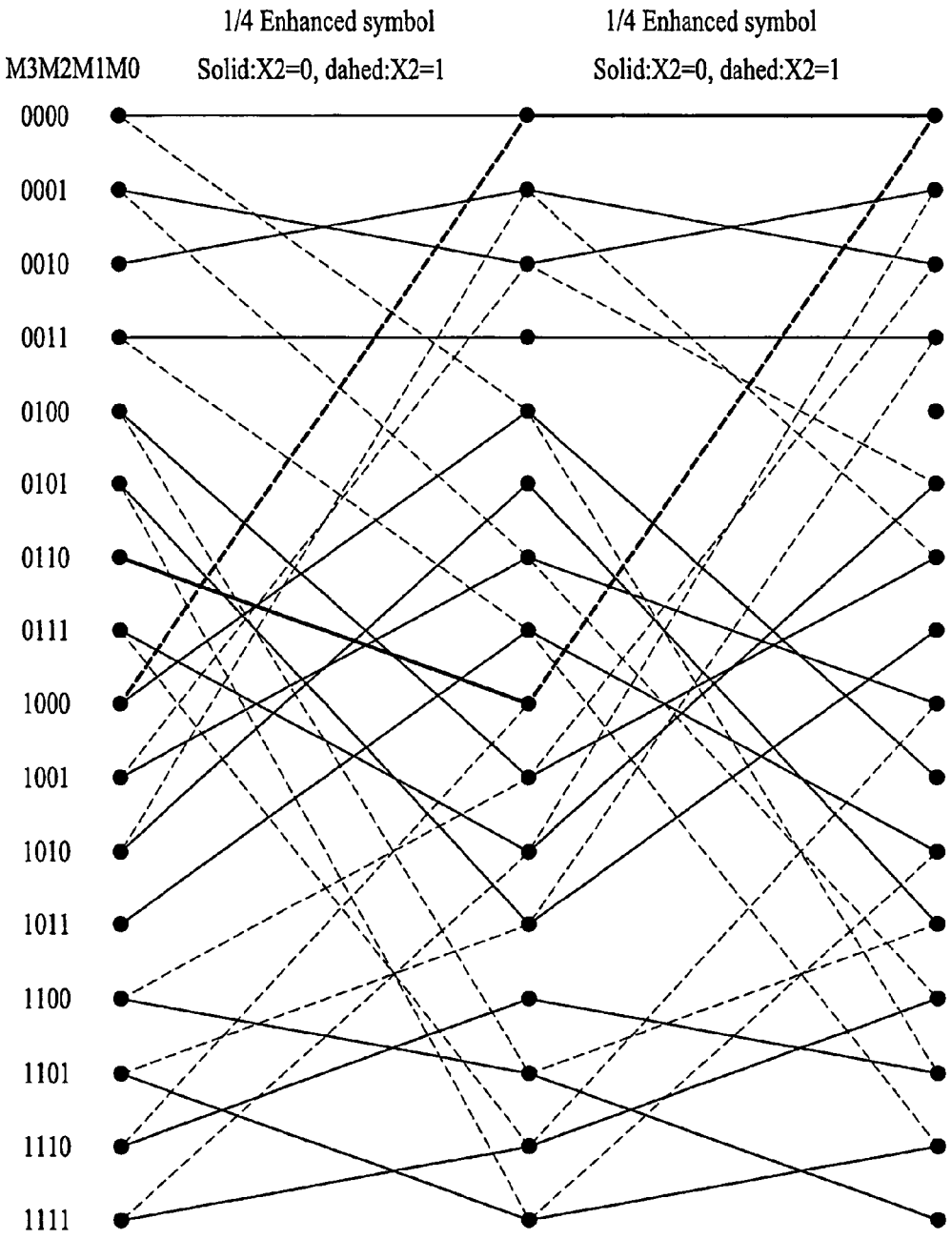
FIG. 7B illustrates a state transition diagram of a ¼ enhanced symbol, when repeated ¼ symbols are different from one another.

FIG. 7A illustrates a state transition diagram of a ¼ enhanced symbol, when repeated ¼ symbols are identical to one another. And, FIG. 7B illustrates a state transition diagram of a ¼ enhanced symbol, when repeated ¼ symbols are different from one another. In case of the ¼ enhanced symbol, the Viterbi decoding process should be performed in 2 symbol units, so as to obtain additional coding gain from the Viterbi decoder. Referring to FIG. 7A, when the repeated ¼ enhanced symbols are identical to one another even after passing through the data randomizer, the Viterbi decoding process is performed while only taking into consideration the path having identical data values during 2 symbols. For example, when the state is '0000', only the path having both data X2 values that are identically equal to '1' and '0' is accounted for, and the paths having different X2 values are excluded from the decoding process, thereby enhancing decoding reliability.

Conversely, referring to FIG. 7B, when the ½ enhanced symbols that are repeated from the null bit expander are different from one another after passing through the data randomizer, the Viterbi decoding process is performed while only taking into consideration the paths having different data values during 2 symbols. For example, when the state is '0000', only the paths having data X2 values different from one another (i.e., '0'→'1' and/or '1'→'0') are accounted for, and the remaining paths are excluded from the decoding process.

In the E8-VSB transmitting system including the enhanced mode, to maintain compatibility with the conventional ATSC 8VSB receiver, the output of the E8-VSB convolution encoder 113 is not directly inputted to the trellis encoder 104 but inputted to the trellis encoder 104 through a series of process steps. Such process steps include passing through each of the ATSC data byte deinterleaver 114a, the RS parity byte remover 114b, the ATSC RS encoder 102, and the ATSC data byte interleaver 103.

Further, in the enhanced symbol processor 402, the main symbol is bypassed, and only the enhanced symbol is processed with additional encoding. However, the parity byte calculated from the ATSC RS encoder 112b, prior to such additional encoding process, does not fit the modified (or changed) data packet. And, accordingly, when the RS decoding process is performed, the conventional ATSC 8VSB receiver determines that an error has occurred in the enhanced data packet. Therefore, in order to maintain the compatibility with the conventional ATSC 8VSB receiver, the output of the E8-VSB convolution encoder 113 is ATSC RS encoded from the ATSC RS encoder 102, so as to recalculate the parity byte. The above-described series of process steps are used to recalculate the parity byte. However, when the recalculated parity byte, which is converted to a symbol, is inputted to the trellis encoder 104 so as to be encoded from the pre-coder, the polarity of the symbol may be inversed, instead of the enhanced symbol being bypassed.

Figure 8:
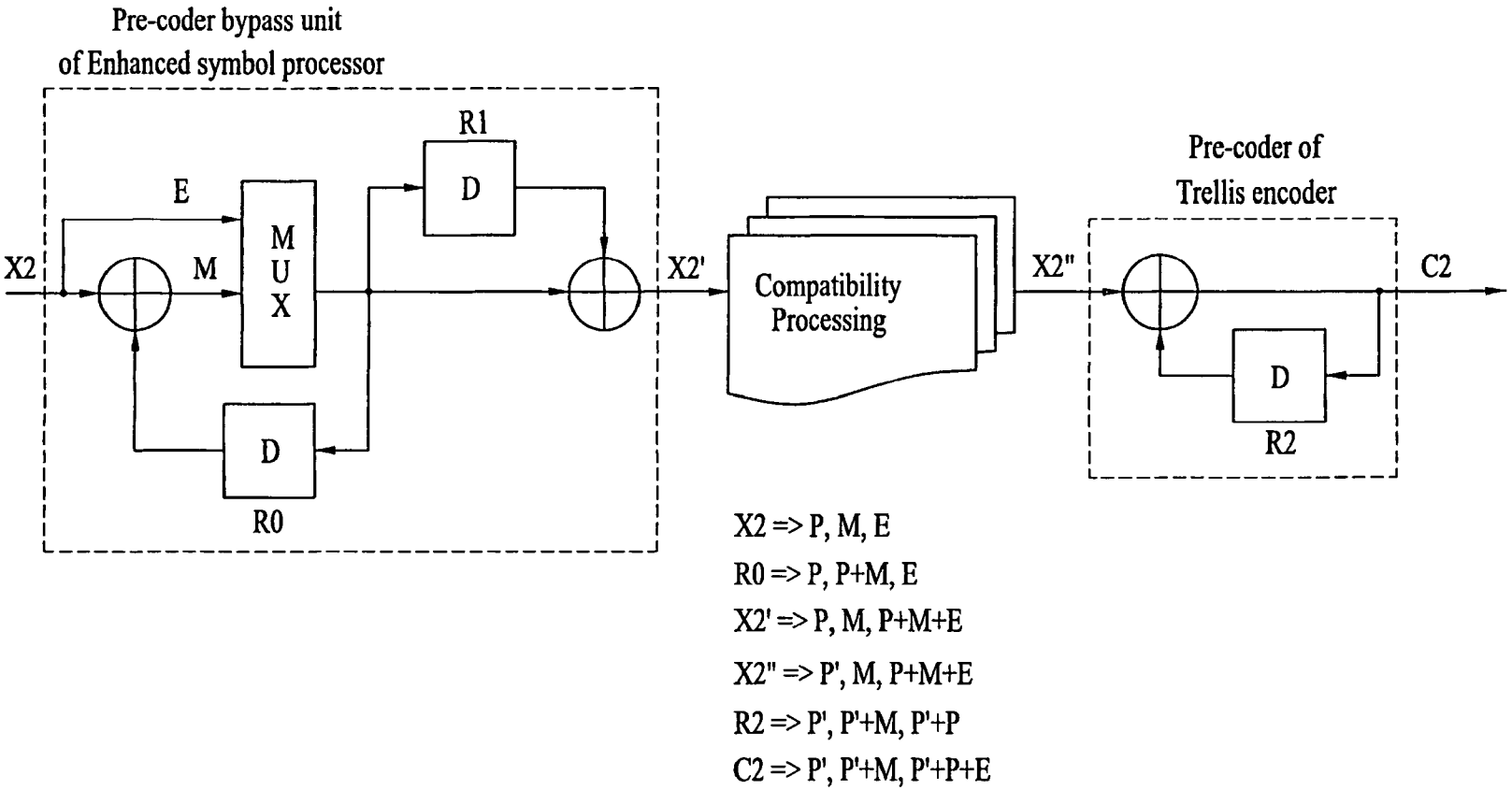
FIG. 8 illustrates an example of a polarity inversion in the enhanced symbol.

FIG. 8 illustrates an example of a polarity inversion in the enhanced symbol. Referring to FIG. 8, the term "compatibility processing" refers to the above-described series of process steps that are used for maintaining compatibility. As shown in FIG. 8, P represents the MSB among the 2 bits when the ATSC RS parity byte, which is added to the enhanced data packet, is converted to a symbol, E represents the MSB of an enhanced symbol, and M represents the MSB of a main symbol. Furthermore, P' represents an MSB of an ATSC RS parity symbol that is recalculated after passing through the compatibility processing. In other words, P is recalculated as P' from the compatibility processing.

Referring to FIG. 8, the adder 411, the multiplexer 412, the registers 413 and 414, and the adder 415 of the enhanced symbol processor 402, shown in FIG. 4B, are collectively referred to as a pre-coder bypass for simplicity of the description. At this point, it is assumed that data is inputted to the pre-coder bypass of the enhanced symbol processor 402 by the order of P, M, and E. Additionally, as shown in FIG. 8, the initial values of registers R2, R1, and R0 are all equal to '0', and the P symbol is assumed and processed as the main symbol at the enhanced symbol processor 402. In this case, the output (X2') of the pre-coder bypass of the enhanced symbol processor 402 is generated in the order of P, M, and P+M+E. These outputs pass through the compatibility processing and are inputted to the pre-coder 510 of the trellis encoder 104. Therefore, the output (C2) of the pre-coder 510 of the trellis encoder 104 is generated in the order of P', P'+M, and P'+P+E.

In conclusion, instead of being directly bypassed as itself, the enhanced symbol is outputted as P'+P+E. At this point, when P' and P are equal to one another (i.e., P'=P), P'+P+E=E, thereby bypassing E as itself. However, when P' and P are different from one another (i.e., P'≠P), the value E is inversed and outputted. Among the 3-bit output of the trellis encoder 104, when C2 being the MSB is inversed, the mapping of the 8-level VSB signal is configured as follows:

$$-7 \Leftrightarrow +1,\ -5 \Leftrightarrow +3,\ - \Leftrightarrow +5,\ -1 \Leftrightarrow +7.$$

More specifically, the VSB modulator 107 maps the 3 output bits (C2, C1, and C0) outputted from the trellis encoder 104 as the corresponding 8-level modulation value, and then the VSB modulator 107 outputs the mapped value. For example, when the value of C2C1C0 is '000', the mapped value is '−7', when the value of C2C1C0 is '011', the mapped value is '−1', and when the value of C2C1C0 is '100', the mapped value is '+1'. Accordingly, when the value of C2C1C0, which is normally supposed to be '000', becomes '100' due to an inversion in the C2 value, the mapped value becomes '+1' instead of '−7'. Therefore, when the symbol is an enhanced symbol, the Viterbi decoder of the E8-VSB receiving system should assume whether the polarity of the output C2 bit, which is outputted from the trellis encoder of the transmitter, has been inversed. In the present invention, such process will be referred to as a polarity inversion of an enhanced symbol.

A "Viterbi algorithm" is an algorithm that calculates the probability of a state transition path according to the time of the trellis encoder and selects the path having the highest probability. A "branch metric" is a calculated value of the probability for each branch with respect to the state transition of the current time, and a "path metric" refers to an accumulation of the branch metric, which is obtained in accordance with the corresponding time. The branch metric can be obtained by calculating a Euclidean distance between the output level of each branch and the input signal of the Viterbi decoder. At this point, since each of the enhanced symbol and the main symbol received at the E8-VSB receiving system is an 8-level signal, the branch metric calculator calculates the Euclidean distance of the input signal for each of the 8 standard levels by using Equation 1 below, so as to obtain 8 different metric values BM(b):

Equation 1

$$BM(b)=(r_n-L_b)^2, \text{ wherein } L_b=(2b-7) \text{ and } 0\leq b\leq 7,$$

wherein $r_n$ represents the signal inputted to the Viterbi decoder at time n, and $L_b$ corresponds to a reference 8-level VSB signal.

Figure 9:
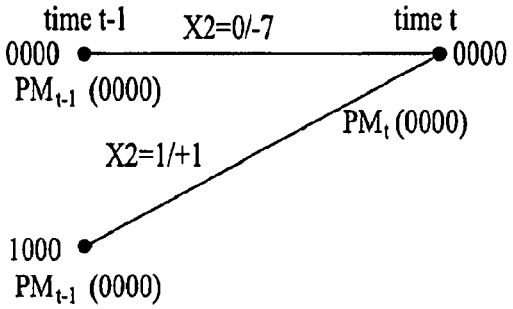
FIG. 9 illustrates an example of a path metric calculation process of the enhanced symbol and the main symbol.
Figure 9:
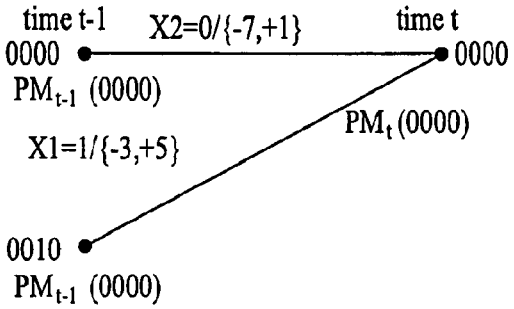

The path metric is a probability value of a transition process of a state, more specifically, a path, and which is an accumulated value of the branch metric. The accumulate/compare/select (ACS) unit of the Viterbi decoder calculates the value for each path metric and compares the calculated values, thereby selecting the path that has the lowest path metric value (i.e., the metric value having the highest probability). More specifically, the ACS unit adds the branch metric, which corresponds to 2 branches for each state, with the path metric of a previous state, which is connected to the corresponding branch, and then selects and stores the smaller value of the two calculated values. FIG. 9 illustrates an example of a path metric calculation process of the enhanced symbol and the main symbol. Referring to FIG. 9, the process of calculating the path metric is described by using state 0000 for each of the enhanced symbol and the main symbol.

When the input symbol is the enhanced symbol, as shown in part (a) of FIG. 9, the previous state (i.e., state of 't−1') that can be merged as the state 0000 of 't' are state 0000 and state 1000. During state 0000 of 't−1', when '0' is inputted as the input X2 of the enhanced symbol processor 402, the reference 8-level value that is outputted from the trellis encoder 104 becomes '−7', if there is no polarity inversion, and becomes '+1', if polarity inversion occurs, thereby creating a path for the state 0000 of 't−1' to be transited to state 0000 of 't'. Meanwhile, during state 1000 of 't−1', when '1' is inputted as the input X2, the reference 8-level value becomes '+1', if there is no polarity inversion, and becomes if polarity inversion occurs, thereby creating a path for the 1000 state of 't−1' to be transited to state 0000 of 't'.

More specifically, if polarity inversion does not occur, the branch metric value of the transition path from state 0000 of 't−1' to state 0000 of 't' is equal to (inputted signal-(−7))$^2$. Conversely, if the polarity inversion occurs, the branch metric value of the transition path from state 0000 of 't−1' to state 0000 of 't' is equal to (inputted signal-(+1))$^2$. Thereafter, at state 0000 of 't', the newly calculated branch metric value is added to the previously accumulated path metric value. Simultaneously, in another path that can be merged as state 0000 of 't' (i.e., the transition path from state 1000 of 't−1' to state 0000 of 't'), the branch metric value is added to the previously accumulated path metric value. Further, the added results of the two states that are merged as state 0000 of 't' are compared, and the path having the lowest added value is selected as the surviving (or remaining) path.

The method for calculating the path metric value of state 0000 of 't' will now be described in detail. Firstly, for each of the two branches that are merged as state 0000 of 't', the branch metric value is added to the path metric value of 't−1', thereby obtaining the current path metric values. Secondly, the two current path metric values are compared, so as to select the path having the lowest path metric value, as the surviving (or remaining) path. Thereafter, the path metric value is renewed (or updated) with the path metric value of the selected path for a following ACS calculation. Finally, a survivor of the selected path and a set of path selecting information are outputted to the path history unit. Herein, the survivor becomes the input X2 bit of the enhanced symbol processor 402. Furthermore, C2 bit is additionally included herein for the enhanced/main integrated Viterbi decoder, which will be described in detail in a later process with reference to FIG. 11, and outputted to the path history unit.

When the input symbol is the main symbol, as shown in part (b) of FIG. 9, the previous states (i.e., states of 't−1') that can become the state 0000 of 't' include state 0000 and state 0010. At state 0000 of 't−1', when '0' is inputted as the input X1 of the enhanced symbol processor 402, the level value that is outputted from the trellis encoder 104 becomes '−7' or '+1', depending upon the input X2 of the trellis encoder 104, thereby forming the state 0000 path of 't'. Meanwhile, during state 0010 of 't−1', when '1' is inputted as the input X1, the level value becomes '−3' or '+5', depending upon the input X2, thereby forming the state 0000 path of 't'.

Accordingly, the method for calculating the path metric value of state 0000 of 't' will now be described in detail. First of all, in each path (i.e., branch) of state 0000, two output level values may be obtained depending upon the input X2. Therefore, the two branch metric values are compared, and the lower one of the two values is selected. Then, the C2 bit corresponding to the selected level value is outputted. Secondly, for each of the two branches that are merged as state 0000 of 't', the branch metric value selected from the above-described first step, is added to the accumulated path metric value of 't−1', thereby obtaining the current path metric values.

Thirdly, the two current path metric values that are calculated in the second step are compared, and the lower one of the two values is selected as the surviving (or remaining) path. Thereafter, the path metric value is renewed (or updated) with the path metric value of the selected path for a following ACS operation. And, finally, a survivor of the selected path and a set of path selecting information are outputted to the path history unit. The survivor includes X1 of the selected path and C2 bit of the first step. Herein, the C2 bit is one of the MSB among the output of the trellis encoder 104, which is decoded as the X2 bit after being processed with post-decoding. More specifically, in case of the main symbol, the survivor for each state is C2 and X1. An example of calculating an accumulated path metric of state 0000 and renewing (or updating) the calculated metric path is shown in part (b) of FIG. 9. The accumulated path metric of other states are also calculated and renewed (or updated) in accordance with the state transition diagram of each inputted symbol.

Since the state for each of the enhanced symbol and the main symbol is transited differently, the ACS unit requires an E/M flag that can identify the enhanced symbol and the main symbol. In addition, an H/Q flag that can identify whether the enhanced symbol is a ½ enhanced symbol or a ¼ enhanced symbol is also required. When the input symbol is the ¼ enhanced symbol, the ACS units require a PNEQ flag that indicates whether the repeated bits, which are repeated from the null byte expander, are identical to or different from one another after passing through the ATSC data randomizer. Meanwhile, in order to estimate the above-described polarity inversion of the enhanced symbol, the ACS units also requires a FLIP signal that indicates at which point the ATSC RS parity symbol is added to the enhanced data segment.

The above-described 4 control signals, more specifically, the E/M flag, the H/Q flag, the PNEQ flag, and the FLIP signal are E8-VSB symbol attribute information that is outputted from the map information recovery unit, which is included in the E8-VSB receiving system. In conclusion, the inputs that are required by the ACS unit includes the E/M flag, the H/Q flag, the PNEQ flag, the FLIP signal, and the branch metric values for 8 reference levels. In addition, a control signal indicating the sections for the field synchronization signal and the segment synchronization signal, which is identical to that of the Viterbi decoder of the conventional ATSC 8T-VSB receiver, is also required. Hereinafter, the description of the control signal indicating the field synchronization signal and the segment synchronization signal will be omitted. The E8-VSB transmitting system includes 12 enhanced symbol processors and 12 trellis encoders. And, accordingly, the E8-VSB receiving system includes 12 Viterbi decoders, which correspond to the enhanced symbol processors and the trellis encoders of the E8-VSB transmitting system.

Figure 10:
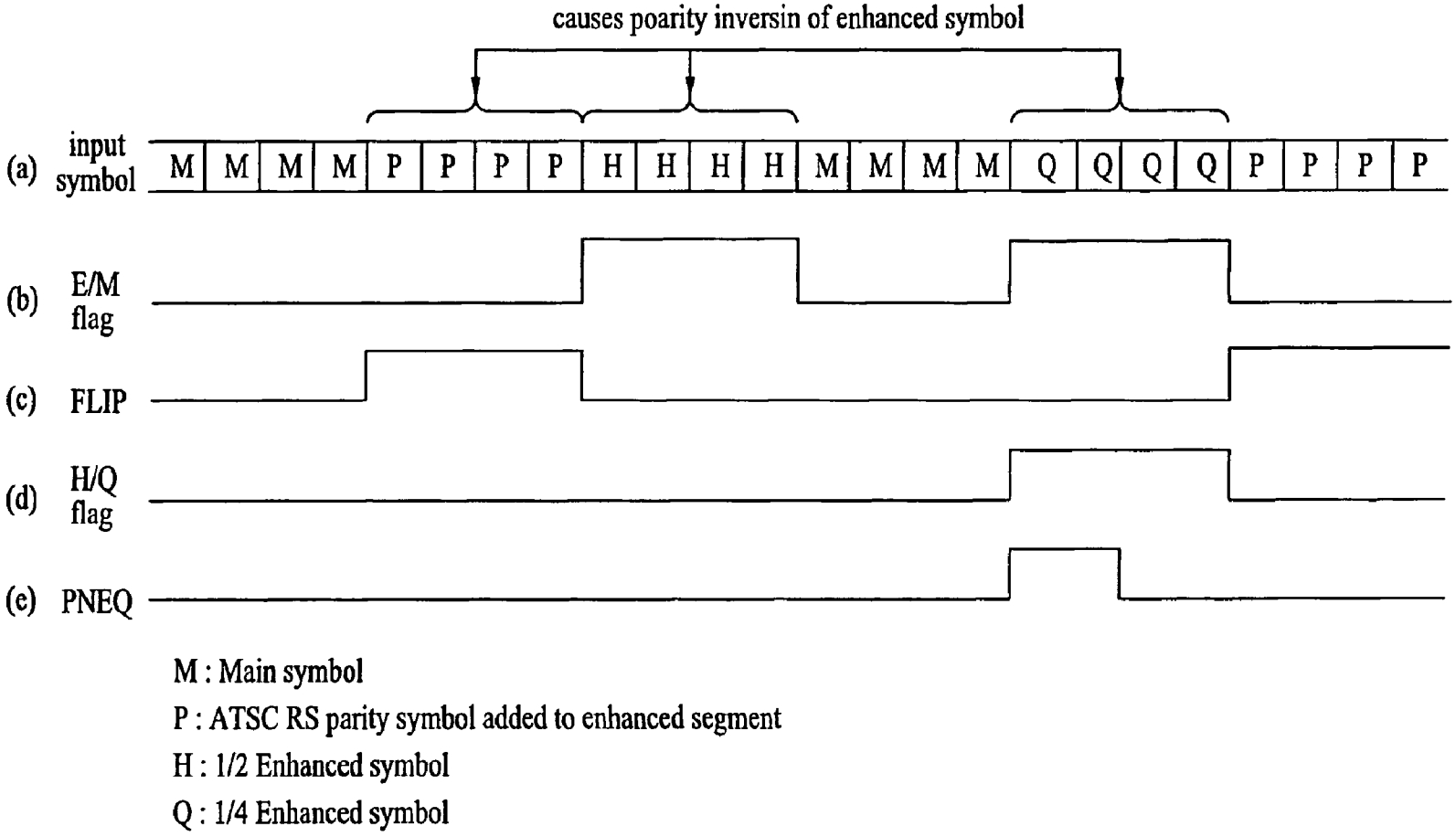
FIG. 10 illustrates examples (a) to (e) of control signals being inputted to the E8-VSB Viterbi decoder.

FIG. 10 illustrates an example of a set of control signals being inputted to any one of the 12 Viterbi decoders. Referring to FIG. 10, M represents the main signal, represents the ½ (half) enhanced symbol, and Q represents the ¼ (quarter) enhanced symbol. Furthermore, P represents a symbol being a conversion of the ATSC RS parity byte that is added to the enhanced data packet. When the E/M flag is high, the current input symbol is an enhanced symbol, and when the E/M flag is low, the current input symbol is a main symbol.

The H/Q signal is only valid in the enhanced symbol section. In this case, when the H/Q signal is low, the enhanced symbol is the ½ enhanced symbol, and when the H/Q signal is high, the enhanced symbol is the ¼ enhanced symbol. Herein, the PNEQ signal is only valid in the ¼ enhanced symbol section, the level of which changes to 2 symbol units. When the level of the PNEQ signal is low, the repeated ¼ enhanced data are changed to different values at the ATSC randomizer. Conversely, when the level of the PNEQ signal is high, the repeated ¼ enhanced data are changed to identical values at the ATSC randomizer. The FLIP signal indicates the point where the polarity conversion of the enhanced symbol occurs. Herein, the FLIP signal is high during the section of the ATSC RS parity symbol that is added to the enhanced data packet.

Meanwhile, when performing an ACS operation of the ¼ enhanced symbol, the basic principle is identical to that of the ½ enhanced symbol. However, the operation of the ACS unit varies according to each symbol. More specifically, when the E/M flag is high and when the H/Q flag is high, the input symbol is the ¼ enhanced symbol. In this case, each of the two symbols performs an ACS operation depending upon the PNEQ signal. The decoding process based on the PNEQ signal is described above in detail with reference to FIG. 6 to FIG. 7B.

In the ACS unit, which is similar to the conventional ATSC 8T-VSB Viterbi decoder, a hardware for performing accumulating, comparing, and selecting operations shares 12 Viterbi decoders, wherein only the embodiment of the path metric for each Viterbi decoder is necessary. The hardware sharing is enabled because the 12 Viterbi decoders are operated sequentially (i.e., in turns) and not simultaneously. Each of the Viterbi decoders consists of a positive decoder and a negative decoder. Since each of the positive decoder and the negative decoder is formed of 12 different states, the total number of path metrics required herein is equal to (12×2×16=384).

As described above, since a polarity inversion may occur when the input symbol is the enhanced symbol, the occurrence of the polarity inversion needs to be estimated. In order to estimate such polarity inversion, a comparison should be made between a path metric value of a decoding process, which is performed under the assumption that polarity inversion did not occur, and a path metric value of another decoding process, which is performed under the assumption that polarity inversion occurred. After comparing the two path metric values, the lower one of the two values (i.e., the value having the higher probability) is selected. Then, the estimation is made in accordance with the selected result. Therefore, in order to estimate such polarity inversion of the enhanced symbol, 2 decoders are required. Hereinafter, one of the decoders is referred to as a "positive decoder", provided that polarity inversion did not occur, and the other one of the decoders is referred to as a "negative decoder", provided that the polarity inversion occurred.

The process of estimating the polarity inversion of the enhanced symbol will now be described. First of all, a minimum path metric value for each of the positive and negative decoders of the ACS unit is calculated. Herein, the minimum path metric value refers to the lowest value among the calculated minimum values for each state at 't'. Secondly, the minimum path metric values of the positive decoder and the negative decoder are compared, and the lower one of the two values is outputted as the polarity signal of the decoder. For example, when the minimum path metric value of the positive decoder is lower than the minimum path metric value of the negative decoder, the polarity signal is positive (+). In other words, the signal selects the positive decoder.

And, finally, in the section where the FLIP signal is low, the path metric values for each state of the decoders that are not selected by the polarity signal are overwritten by the path metric values corresponding to the selected decoders, and then the ACS operation is performed. For example, provided that the positive decoder is the selected decoder, the path metric values for each state of the positive decoder written over the path metric values for each state corresponding to the negative decoder. At this point, if the positive decoder is selected, then it is assumed that the polarity inversion did not occur. Conversely, if the negative decoder is selected, then it is assumed that the polarity inversion has occurred. Furthermore, the polarity inversion estimator, which estimates the polarity inversion as described above, may also be shared among the 12 Viterbi decoders.

In the Viterbi algorithm, the input of a surviving (or remaining) path, i.e., the survivor, which is selected from each state during the ACS operation, is stored, so as to maintain the path history during the time length of a decoding depth. The path history unit receives polarity signals (i.e., signals selecting one of the positive decoder and the negative decoder) outputted from the polarity inversion estimator and state numbers having minimum path metrics outputted from the ACS unit. Then, the path history unit traces-back the path history of the corresponding state, so as to output the final decision. In the path history unit, in the section where the FLIP signal is low, the path history for each state of the decoders that are not selected by the polarity signal are overwritten by the path history of the selected decoders, thereby renewing (or updating) the path history.

According to a general Viterbi decoding process, the symbols inputted to the Viterbi decoder includes the enhanced symbol and the main symbol. Therefore, the enhanced symbol survivor and the main symbol survivor are stored in the path history unit in the same order. Thus, the Viterbi decoder becomes the enhanced/main (E/M) integrated decoder, which decodes both the enhanced symbol and the main symbol. Also, the final outputs of the decoder are outputted in the same order at regular time intervals with the corresponding inputs. In the present invention, the E8-VSB Viterbi decoder includes 16 states, each state outputting 2 survivor bits from the ACS unit, which are then stored according to the time length of the decoding depth. Therefore, the E8-VSB Viterbi decoder requires a memory having the capacity of 16× decoding depth×2 bits. Furthermore, since the history for each of the positive decoder and the negative decoder should be maintained individually, the memory should have the capacity of 2×16× decoding depth×2 bits. Meanwhile, since 12 Viterbi decoders are required in the present invention, the memory of the E8-VSB Viterbi decoder requires a total capacity of 12×2×16× decoding depth×2 bits.

FIG. 11 illustrates an enhanced/main integrated Viterbi decoder according to a first embodiment of the present invention. The branch metric calculator 611 calculates the Euclidian distance between the input symbol and each of the 8 reference output levels, so as to obtain a total of 8 branch metric values. Then, the branch metric calculator 611 outputs the calculated branch metric values to the ACS unit 612 of the positive decoder and the ACS unit 613 of the negative decoder. At this point, the 8-level reference values used for calculating the branch metric value with the input symbol are −7, −5, −3, −1, +1, +3, +5, and +7. Particularly, −7, −5, −3, and −1 are reference output level values when C2 bit is equal to '0', and +1, +3, +5, and +7 are reference output level values when C2 bit is equal to '1'.

In addition, as described above, the polarity inversion may occur when the input symbol is the enhanced symbol. More specifically, at state 0000 of 't−1', when '0' is inputted as the input X2 of the enhanced symbol processor 402, the reference 8-level value that is outputted from the trellis encoder 104 becomes-7, if the polarity inversion does not occur, and become +1, if the polarity inversion occurs, thereby forming a transition path from state 0000 of 't−1' to state 0000of 't'. Therefore, the metric value becomes different depending upon whether polarity inversion occurs or not within the same path.

Accordingly, the ACS unit 612 of the positive decoder receives the branch metric value of the instance when the polarity inversion has not occurred from the branch metric calculator 611. Then, the ACS unit 612 of the positive decoder receives the control signals, such as the E/M signal, the H/Q signal, the FLIP signal, and the PNEQ signal, from the map information recovery unit, so as to perform the ACS operation. In other words, for each two branches of each state, each of the ACS unit 612 of the positive decoder and the ACS unit 613 of the negative decoder respectively adds the corresponding branch metric value and the path metric value of a previous state, which is connected to the corresponding branch. Then, each of the ACS units 612 and 613 selects and stores the smallest value that is obtained. Thus, the survivor and the path selecting information are outputted to the path history units 615 and 616 of the positive decoder and the negative decoder, respectively. For example, when the inputted symbol is the enhanced symbol, the survivor for each state becomes the X2 and C2 bits, and when the inputted symbol is the main symbol, the survivor for each state becomes the X1 and C1 bits.

In addition, among the path metric values for each state, each of the ACS unit 612 of the positive decoder and the ACS unit 613 of the negative decoder selects the lowest value as the path metric value and outputs the selected value to the polarity inversion estimator 614. Then, the state number having the minimum (or lowest) path metric value is outputted to the path history unit 615 of the positive decoder and the path history unit 616 of the negative decoder.

In the present invention, in the symbol section (i.e., the section where the FLIP signal is high) causing the polarity inversion, the path metric value for each state of the selected decoder, which is selected in accordance with the polarity estimated from the polarity inversion estimator 614, is written over the path metric value for each state of the non-selected decoder. Thereafter, the ACS operation is performed. The polarity inversion estimator 614 receives the FLIP signal and the minimum path metric value from the ACS unit 612 of the positive decoder and the ACS unit 613 of the negative decoder and estimates the polarity inversion. For example, if it is determined that the minimum path metric value outputted from the ACS unit 613 of the negative decoder is smaller (or lower) than the minimum path metric value outputted from the ACS unit 612 of the positive decoder, then the polarity inversion estimator 614 estimates that polarity inversion has occurred. Conversely, if it is determined that the minimum path metric value outputted from the ACS unit 613 of the negative decoder is greater than the minimum path metric value outputted from the ACS unit 612 of the positive decoder, then the polarity estimator 614 estimates that polarity inversion has not occurred. Subsequently, the polarity estimator 614 outputs the polarity result to each of the ACS unit 612 and the path history unit 615 of the positive decoder and the ACS unit 613 and the path history unit 616 of the negative decoder, respectively.

Each of the path history unit 615 of the positive decoder and the path history unit 616 of the negative decoder receives the control signals, such as the E/M signal, the H/Q signal, the FLIP signal, and the PNEQ signal, the survivor, path selecting information, and the state number which has a minimum path metric value among states, so as to maintain the path history during the decoding depth. In addition, the state corresponding to the minimum path metric value for each of the decoders is back-traced, so that the survivor of a previous time, which precedes the time length of the decoding depth, is outputted to the decision selecting unit 617 as the decoding decision value. Furthermore, in the section where the FLIP signal is high, each of the path history units 615 and 616 of the positive decoder and the negative decoder writes the path history of the selected decoder, which is selected in accordance with the polarity signal, over the path history of the non-selected decoder.

The decision selecting unit 617 selects the decoding decision value of the selected decoder, which is selected in accordance with the polarity signal of the polarity inversion estimator 614, and outputs the selected value to the post-decoder 618 and the output multiplexer 619. For example, when the positive decoder is selected by the polarity inversion estimator 614, the decoding decision value outputted from the path history unit 615 of the positive decoder is selected and outputted. Among the decoding decision values, the C2 bit is outputted to the post-decoder 618, and the X2 or X1 bit is outputted to the output multiplexer 619.

More specifically, since the main symbol is pre-coded at the transmitting terminals, a post-decoding process (i.e., the reverse process of pre-coding) should be performed. In this case, the post-decoder 618 post-decodes the C2 bit without identifying whether the symbol is a main symbol or an enhanced symbol and, then, outputs the post-decoded C2 bit to the output multiplexer 619. When the symbol is the enhanced symbol, the output multiplexer 619 outputs the X2 bit instead of the post-decoded result, as the higher bit, and outputs a dummy bit as the X1 bit, which is the lower bit. On the other hand, when the symbol is the main symbol, the X1 bit is outputted as the lower bit and the post-decoded result is outputted as the higher bit.

Since the enhanced symbol is processed with additional convolution encoding, as compared with the main symbol, there is a significant difference between the enhanced symbol and the main symbol in performance after being decoded. However, when the enhanced symbol and the main symbol are inputted to the path history unit in combination, due to the small number of enhanced symbols within a set portion of the decoding depth, the valid decoding depth of the enhanced symbols may be reduced. As a result, the main symbols may cause the decoding effect of the enhanced symbols to be deficient. Such problems may worsen as the amount of the enhanced data becomes lower. Therefore, in order to reduce the influence of the main symbol on the enhanced symbol, only the enhanced symbols should be inputted to the path history unit, so as to ensure a set portion of valid decoding depth. Since the decision of the enhanced symbol is performed only on the X2 bit, the memory capacity required in the path history unit is 12×2×16× decoding depth×1 bit. However, since the main symbol and the enhanced symbol are multiplexed, the main symbol may interrupt the state transition of the enhanced symbol.

Figure 12:
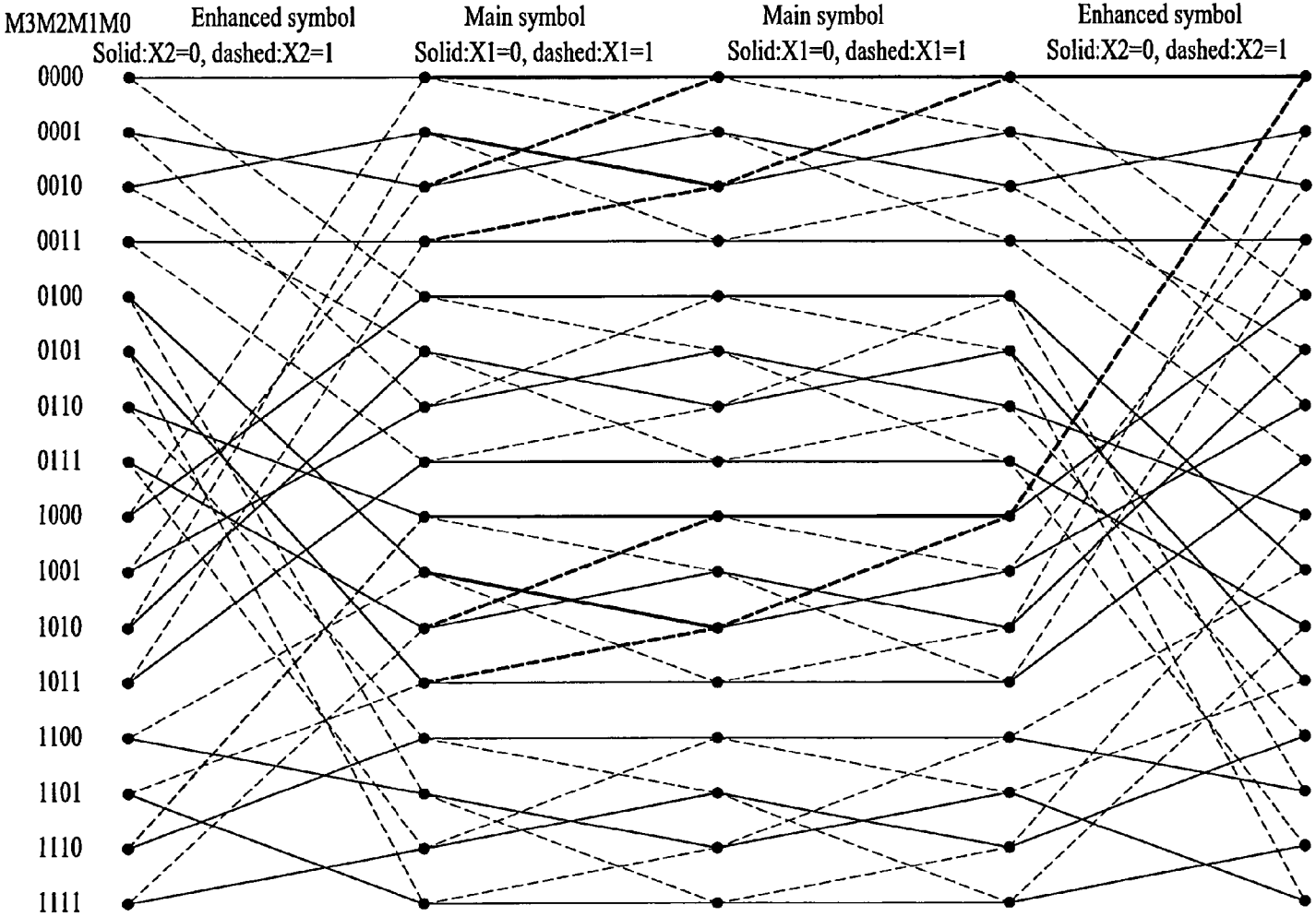
FIG. 12 illustrates a state transition diagram of an enhanced symbol being interrupted by a main symbol.

FIG. 12 illustrates an interruption of the state transition diagram of the enhanced symbol caused by the main symbol. Although the actual main symbol interruption occurs in multiples of 4 symbols, the interruption of only two symbols will be described with reference to FIG. 12 for simplicity. Herein, the enhanced symbol directly preceding the main symbol interruption will be referred to as a first enhanced symbol, and the enhanced symbol directly following the main symbol interruption will be referred to as a second enhanced symbol. The bold line shown in FIG. 12 describes the paths connected by state 0000 of the second enhanced symbol. Referring to FIG. 12, the first enhanced symbol includes 8 states, which can be connected to each state of the second enhanced symbol. In other words, each state of the second enhanced symbol includes 2 branches in accordance with the input X2 bit, and herein, 4 states can be connected to each branch. At this point, the enhanced-only Viterbi decoder should estimate the state transition from the first enhanced symbol to the second enhanced symbol. Therefore, two different methods of dealing with the main symbol interruption from the ACS unit of the enhanced-only Viterbi decoder may be proposed, which will now be described as follows.

In the first method, each of the 8 states that can be connected to each state of when performing the ACS operation during the second enhanced symbol section, without performing the ACS operation during the first the main symbol section, is compared to one another, so that the state having the minimum metric value can be selected. More specifically, there are two branches in each state during the second enhanced symbol, wherein each branch may be connected to 4 states of the first enhanced symbol. Accordingly, the state having the minimum metric value among the 4 states (i.e., the path metric value of the previous state) is selected, and the selected path metric of the previous state is added to the branch metric value of the corresponding branch. The added result becomes the current path metric value of each branch. At this point, since each state of the second enhanced symbol includes 2 branches, the current metric value of the two branches for each state is compared to one another, so as to select the smallest (or lowest) path metric value and to store the path metric value of the corresponding state. Thereafter, the survivor of the selected path and the path selecting information is outputted to the path history unit.

On the other hand, in the second method, by performing the ACS operation during the main symbol section, the state transition can be continuously estimated during the main symbol section. Although the ACS operation is performed during the main symbol section, the enhanced-only Viterbi decoder does not store the selected survivor in the path history unit during the main symbol section. However, the path selecting information, which is obtained by the ACS operation in the main symbol section, is used to exchange the path history of each state at the path history unit. For example, only the path selecting information, which is obtained by the ACS operation for the main symbol, is outputted to the path history unit, and the survivor of the selected path may not be outputted to the path history unit. In another example, the survivor and the path selecting information that are obtained by the ACS operation result are all outputted to the path history unit. And, when the symbol inputted from the path history unit is the main symbol, then the survivor may not be received and only the path selecting information may be received. Furthermore, since the path history unit of the enhanced-only Viterbi decoder only operates when the input survivor is the enhanced symbol, the order of the finally decoded and outputted symbol may be different from that of the symbol of the Viterbi decoder input.

FIG. 13 illustrates the above-described effect in detail. Part (a) of FIG. 13 shows an input symbol sequence being inputted to any one of the 12 Viterbi decoders. Referring to FIG. 13, E represents the enhanced symbol, M represents the main symbol, and the numeral following E or M represents the time index. Part (b) of FIG. 13 shows a symbol column being finally outputted from an enhanced/main integrated Viterbi decoder, wherein it is known that decoding decision values are outputted in the same order of the input symbol sequence, after a set portion of decoding depth. Finally, part (c) of FIG. 13 shows the output order of the decoding decision values of the enhanced-only Viterbi decoder.

As shown in part (c) of FIG. 13, since 8 enhanced symbols should be inputted to the path history unit in order to make a decision for an input E1 (i.e., decoding depth=8 assumptions), the decision for E1 can be made when E17 is inputted. In the input terminal of the Viterbi decoder, the symbols are inputted in the order of symbols E1, E2, E3, and E4, then symbols M5, M6, M7, and M8, followed by symbols E9, E10, E11, and E12. Subsequently, in the final output, symbols E1, E2, E3, and E4 and symbols E9, E10, E11, and E12 are outputted consecutively. This is because the path history unit of the enhanced-only Viterbi decoder is only operated when enhanced symbols are inputted. Therefore, the decoding decision of the enhanced-only Viterbi decoder should be re-ordered to be in the same order as that of the input symbol column.

Figure 14:
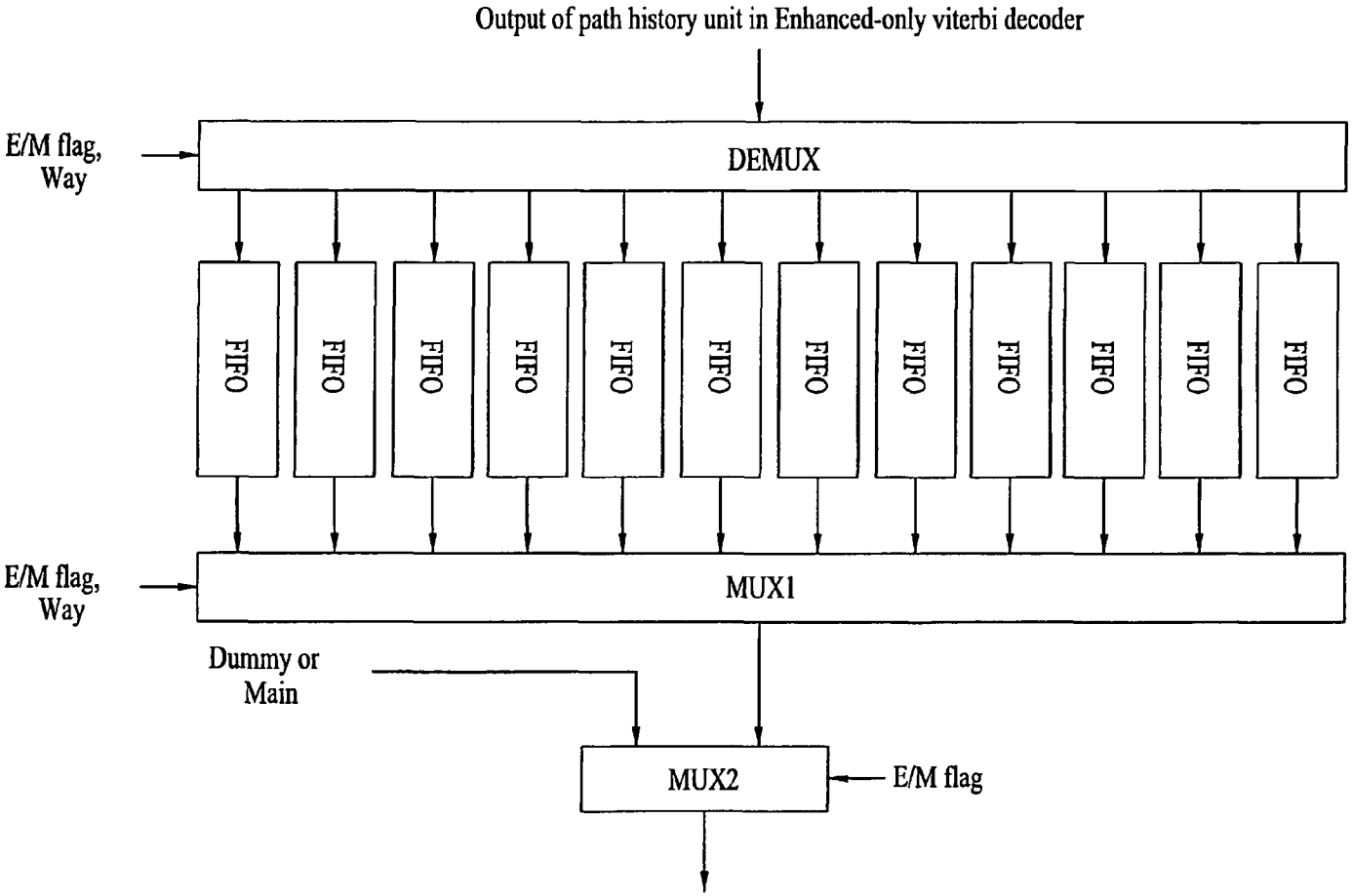
FIG. 14 illustrates a re-ordering of the enhanced symbol.

FIG. 14 illustrates a re-ordering of decoded enhanced symbol outputs. The decoding decision, which is outputted from the path history unit of each 12 Viterbi decoders, is serially outputted in a time-division method. Accordingly, a demultiplexer stores the corresponding decoded decision value in a first-in first-out (FIFO) unit in accordance with a way signal (i.e., signal indicating which of the 12 decoders is being used). At this point, since the FIFO unit performs buffering only on the enhanced symbol, the demultiplexer operates only during the section where the E/M flag is high. In addition, a first multiplexer (MUX1) also operates only during the section where the E/M flag is high and receives a way signal, so as to output the output of the corresponding FIFO unit. Referring to FIG. 14, the E/M flag and the way signal used in the first multiplexer (MUX1) has a set amount of time delay as compared to the signals used in the demultiplexer. Meanwhile, an E/M flag used in a second multiplexer (MUX2) is identical to that of the first multiplexer (MUX1). Also, the second multiplexer (MUX2) multiplexes the output of the first multiplexer (MUX1) during the section where the E/M flag is high. Alternatively, during the section where the E/M flag is low, the second multiplexer (MUX2) either outputs a set of dummy data or multiplexes and outputs the output of the main-only Viterbi decoder. When the dummy data is multiplexed, the enhanced symbol and the main symbol are each outputted through a separate path from the final output of the Viterbi decoder. On the other hand, when the main symbol is multiplexed, the decoded result of the enhanced symbol and the main symbol is outputted through a single path.

FIG. 15 illustrates an enhanced-only Viterbi decoder according to a second embodiment of the present invention. A branch metric calculator 811 and a polarity inversion estimator 814 of the enhanced-only Viterbi decoder are identical to those of the enhanced/main integrated Viterbi decoder, shown in FIG. 11, and so the description of the same will be omitted for simplicity. Also, the operations of an ACS unit 812 of a positive decoder and an ACS unit 813 of a negative decoder have been described above. In the enhanced-only Viterbi decoder, the survivor being outputted to the path history unit includes only one X2 bit. Therefore, the memory capacity required in the path history units 815 and 816 is 12×2×16× decoding depth×1 bit. Furthermore, the enhanced-only Viterbi decoder further includes a re-ordering unit 818 for performing the re-ordering of the output as described in FIG. and FIG. 14. Since the main-only Viterbi decoder is identical to the Viterbi decoder of the conventional ATSC 8T-VSB receiver, the description of the same will be omitted.

The channel equalizing system used in the E8-VSB receiving system performs channel equalization by using an 8-level decision. The decision value obtained by using a Viterbi decoding process is more reliable than the decision value obtained by using an 8-level slicer. Therefore, in the present invention, by feeding-back the 8-level decision that is performed from the Viterbi decoder to the channel equalizing system, the capacity of channel equalization may be enhanced.

In order to feed-back decision from the ACS unit, a state having the minimum path metric value is identified from the ACS unit of the E8-VSB Viterbi decoder. Then, an output level (i.e., one of the 8 levels) of a selected path of the identified state is fed-back to the channel equalizing system. At this point, one of the output levels of each ACS unit of the positive and negative decoders is selected in accordance with the polarity signal, which is outputted from the polarity inversion estimator of the enhanced symbol. Thereafter, the selected output level is fed-back to the channel equalizing system. This generally corresponds to the decision feedback of the Viterbi decoder, when the decoding depth is '0'.

The reliability of a decision value of the Viterbi decoder may increase in accordance with an increase of the decoding depth to a certain extent. However, the increase of the decoding depth may cause a longer time delay before the decoding decision. When the decoding depth of the Viterbi decoder of the E8-VSB receiver increases by 1, the time delay of the decision feedback may increase as much as 12 symbols. However, in the channel equalizing system, when the path history unit feeds-back the decoding decision for each decoding depth, a decision value having a maximum reliability within a range allowed by the time delay may be obtained and used. Accordingly, when the survivor is outputted from the ACS unit of the Viterbi decoder, the output level information (i.e., 3 bits including C2C1C0) of a selected path should also be added. Then, the path history unit stores the output level information (i.e., the 3 bits C2C1C0) and maintains the history corresponding to the time equivalent to the decoding depth. Furthermore, the survivor of the state having the minimum path metric value is outputted at each trace-back stage, so as to feed-back the outputted survivor to the channel equalizing system.

In the channel equalizing system, the decisions for each of the enhanced symbol and the main symbol should all be fed-back and the decision delay should be reduced. Therefore, it is preferable that the feedback is performed while setting the enhanced/main integrated Viterbi decoder as the basic decoder. Accordingly, when the survivor is outputted from the ACS unit of FIG. 11, the 3 bits C2C1C0 are additionally outputted. Then, the 3 bits C2C1C0 are added to the conventional 2 bits and stored in the path history unit. Thereafter, the state having the minimum path metric value, which is inputted from the ACS unit, is identified, and C2C1C0 for each decoding depth are outputted and fed-back through the channel equalizing system. Evidently, the feedback outputted from the positive decoder and the feedback outputted from the negative decoder should be selected in accordance with the polarity signal of the polarity inversion estimator.

The Viterbi decoder of the E8-VSB receiving system has the following advantages. First of all, an enhanced symbol and a main symbol may all be decoded. When using the enhanced symbol, an enhanced symbol processor and a trellis encoder being concatenated to one another are collectively decoded, thereby enhancing the decoding capacity. Moreover, the enhanced symbol is divided into a ½ enhanced symbol and a ¼ enhanced symbol, which are decoded accordingly. Herein, the decoding of the ¼ enhanced symbol is more reliable than the decoding of the ½ enhanced symbol. Also, in the present invention, a polarity inversion of the enhanced symbol can be estimated. Furthermore, an enhanced-only Viterbi decoder is configured in order to minimize the adverse effect that the main symbol may cause to the decoding capacity of the enhanced symbol. Finally, an 8-level decision performed at the Viterbi decoder is fed-back to a channel equalizing system, thereby enhancing the channel equalizing capacity.

The terminologies used in the description of the present invention have been defined while taking into account the functions of the present invention. Such terminologies may vary depending upon the intentions or practice of those skilled in the art. Therefore, a specific definition for each term should be made and given based on the overall description of the present invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

[1. A method for processing a digital television (DTV) broadcast signal in a broadcasting receiver, the method comprising:

receiving, by a tuner, the DTV broadcast signal including enhanced data;

equalizing the received DTV broadcast signal by compensating channel distortion of the received DTV broadcast signal;

decoding signaling information from the equalized DTV broadcast signal, wherein the signaling information includes information indicating whether the enhanced data are coded at a ½ code rate or at a ¼ code rate;

decoding, by a decoder, the enhanced data included in the equalized DTV broadcast signal; and derandomizing, by a derandomizer, the decoded enhanced data, wherein the enhanced data in the received DTV broadcast signal are generated in a broadcast transmitter by:

randomizing original enhanced data, first Reed Solomon (RS) encoding the randomized original enhanced data, convolutional encoding the first RS-encoded original enhanced data, second RS encoding the convolutional encoded original enhanced data, interleaving the second RS-encoded original enhanced data, and trellis encoding the interleaved original enhanced data.]

[2. The method of claim 1, wherein the received DTV broadcast signal further includes main data that the convolutional encoding is not performed.]

[3. The method of claim 1, wherein the enhanced data is decoded based on the signaling information.]

[4. The method of claim 1, wherein the received DTV broadcast signal further includes segment synchronization data and field synchronization data.]

[5. A broadcasting receiver for processing a digital television (DTV) broadcast signal, the broadcasting receiver comprising:

a tuner for receiving the DTV broadcast signal including enhanced data;

an equalizer for equalizing the received DTV broadcast signal by compensating channel distortion of the received DTV broadcast signal;

an information recovery unit for decoding signaling information from the equalized DTV broadcast signal, wherein the signaling information includes information indicating whether the enhanced data are coded at a ½ code rate or at a ¼ code rate;

a decoder for decoding the enhanced data included in the equalized DTV broadcast signal; and a derandomizer for derandomizing the decoded enhanced data, wherein the enhanced data in the received DTV broadcast signal are generated in a broadcast transmitter by:

randomizing original enhanced data, first Reed Solomon (RS) encoding the randomized original enhanced data, convolutional encoding the first RS-encoded original enhanced data, second RS encoding the convolutional encoded original enhanced data, interleaving the second RS-encoded original enhanced data, and trellis encoding the interleaved original enhanced data.]

[6. The broadcasting receiver of claim 5, wherein the received DTV broadcast signal further includes main data that the convolutional encoding is not performed.]

[7. The broadcasting receiver of claim 5, wherein the decoder decodes the enhanced data based on the signaling information.]

[8. The broadcasting receiver of claim 5, wherein the received DTV broadcast signal further includes segment synchronization data and field synchronization data.]

*9. A method for processing a broadcast signal in a broadcasting receiver, the method comprising:*

*receiving the broadcast signal including first enhanced data, second enhanced data and signaling information, wherein the first enhanced data are encoded at a first code rate and the second enhanced data are encoded at a second code rate;*

*demodulating the received broadcast signal;*

*decoding the signaling information in the demodulated broadcast signal, wherein the decoded signaling information includes information for identifying the first enhanced data and the second enhanced data;*

*decoding the first enhanced data in the demodulated broadcast signal based on the decoded signaling information; and*

*decoding the second enhanced data in the demodulated broadcast signal based on the decoded signaling information.*

*10. The method of claim 9, further comprising:*

*derandomizing the decoded first enhanced data and the decoded second enhanced data.*

*11. The method of claim 9, wherein the broadcast signal further includes main data multiplexed with the first and second enhanced data.*

*12. The method of claim 11, wherein the decoded signaling information further includes information for identifying the main data.*

*13. A broadcasting receiver for processing a broadcast signal, the broadcasting receiver comprising:*

*a tuner for receiving the broadcast signal including first enhanced data, second enhanced data and signaling information, wherein the first enhanced data are encoded at a first code rate and the second enhanced data are encoded at a second code rate;*

*a demodulator for demodulating the received broadcast signal;*

*a signaling decoder for decoding the signaling information in the demodulated broadcast signal, wherein the decoded signaling information includes information for identifying the first enhanced data and the second enhanced data; and*

*a decoder for decoding the first enhanced data in the demodulated broadcast signal based on the decoded signaling information and decoding the second enhanced data in the demodulated broadcast signal based on the decoded signaling information.*

*14. The broadcasting receiver of claim 13, further comprising:*

*a derandomizer for derandomizing the decoded first enhanced data and the decoded second enhanced data.*

*15. The broadcasting receiver of claim 13, wherein the broadcast signal further includes main data multiplexed with the first and second enhanced data.*

*16. The broadcasting receiver of claim 15, wherein the decoded signaling information further includes information for identifying the main data.*

* * * * *